United States Patent
Song et al.

(10) Patent No.: US 11,688,462 B2
(45) Date of Patent: Jun. 27, 2023

(54) THREE-DIMENSIONAL FLASH MEMORY WITH BACK GATE

(71) Applicants: IUCF-HYU (INDUSTRY-UNIVERSITY COOPERATION FOUNDATION HANYANG UNIVERSITY), Seoul (KR); PeDiSem Co., Ltd., Seoul (KR)

(72) Inventors: Yun Heub Song, Seoul (KR); Chang Eun Song, Seoul (KR)

(73) Assignees: IUCF-HYU (INDUSTRY-UNIVERSITY COOPERATION FOUNDATION HANYANG UNIVERSITY), Seoul (KR); PeDiSem Co., Ltd., Seoul (KR)

( * ) Notice: Subject to any disclaimer, the term of this patent is extended or adjusted under 35 U.S.C. 154(b) by 39 days.

(21) Appl. No.: 17/353,983

(22) Filed: Jun. 22, 2021

(65) Prior Publication Data
US 2021/0398593 A1    Dec. 23, 2021

(30) Foreign Application Priority Data

Jun. 23, 2020  (KR) .................. 10-2020-0076115
Aug. 3, 2020   (KR) .................. 10-2020-0096526
Oct. 14, 2020  (KR) .................. 10-2020-0132388

(51) Int. Cl.
*G11C 11/34*    (2006.01)
*G11C 16/04*    (2006.01)
(Continued)

(52) U.S. Cl.
CPC .......... *G11C 16/0483* (2013.01); *G11C 16/08* (2013.01); *G11C 16/16* (2013.01);
(Continued)

(58) Field of Classification Search
CPC ..... G11C 16/0483; G11C 16/08; G11C 16/16; G11C 16/24; G11C 16/26; G11C 16/30;
(Continued)

(56) References Cited

U.S. PATENT DOCUMENTS 6,191,975 B1 *  2/2001  Shimizu ................. H10B 69/00
                                              257/E27.103
6,243,295 B1 *  6/2001  Satoh ................. G11C 16/0483
                                              257/E27.103
(Continued)

FOREIGN PATENT DOCUMENTS

CN    105144296 A  * 12/2015  ......... G11C 11/5671
JP    2016058652 A  *  4/2016
KR    10-2017-0093099 A    8/2017

OTHER PUBLICATIONS

Communication dated Jun. 27, 2022 from the Korean Patent Office in Korean Application No. 10-2020-0132388.
(Continued)

Primary Examiner — Viet Q Nguyen
(74) Attorney, Agent, or Firm — Sughrue Mion, PLLC

(57) ABSTRACT

Disclosed is a three-dimensional flash memory including a back gate, which includes word lines extended and formed in a horizontal direction on a substrate so as to be sequentially stacked, and strings penetrating the word lines and extended and formed in one direction on the substrate. Each of the strings includes a channel layer extended and formed in the one direction, and a charge storage layer extended and formed in the one direction to surround the channel layer, the channel layer and the charge storage layer constitute memory cells corresponding to the word lines, and the channel layer includes a back gate extended and formed in the one direction, with at least a portion of the back gate
(Continued)

surrounded by the channel layer, and an insulating layer extended and formed in one direction between the back gate and the channel layer.

13 Claims, 54 Drawing Sheets

(51) Int. Cl.
| | |
|---|---|
| *G11C 16/08* | (2006.01) |
| *G11C 16/16* | (2006.01) |
| *G11C 16/24* | (2006.01) |
| *G11C 16/26* | (2006.01) |
| *G11C 16/30* | (2006.01) |
| *H10B 41/10* | (2023.01) |
| *H10B 41/27* | (2023.01) |
| *H10B 41/35* | (2023.01) |
| *H10B 41/41* | (2023.01) |
| *H10B 43/10* | (2023.01) |
| *H10B 43/27* | (2023.01) |
| *H10B 43/35* | (2023.01) |
| *H10B 43/40* | (2023.01) |

(52) U.S. Cl.
CPC .............. *G11C 16/24* (2013.01); *G11C 16/26* (2013.01); *G11C 16/30* (2013.01); *H10B 41/10* (2023.02); *H10B 41/27* (2023.02); *H10B 41/35* (2023.02); *H10B 41/41* (2023.02); *H10B 43/10* (2023.02); *H10B 43/27* (2023.02); *H10B 43/35* (2023.02); *H10B 43/40* (2023.02)

(58) Field of Classification Search
CPC ......... H01L 27/11519; H01L 27/11524; H01L 27/11529; H01L 27/11556; H01L 27/11565; H01L 27/1157; H01L 27/11573; H01L 27/11582

USPC ........................................................ 365/174
See application file for complete search history.

(56) References Cited

U.S. PATENT DOCUMENTS

| | | | | |
|---|---|---|---|---|
| 8,374,032 | B2* | 2/2013 | Namiki | G11C 16/0483 365/185.02 |
| 8,980,712 | B2* | 3/2015 | Joo | H01L 29/792 438/266 |
| 9,312,134 | B2* | 4/2016 | Fukuzumi | H01L 29/7926 |
| 9,355,727 | B1* | 5/2016 | Zhang | G11C 16/26 |
| 9,449,985 | B1* | 9/2016 | Rabkin | H01L 27/1157 |
| 9,576,971 | B2* | 2/2017 | Zhang | H01L 27/11556 |
| 9,627,395 | B2* | 4/2017 | Zhang | H01L 27/11524 |
| 9,786,679 | B2* | 10/2017 | Fukuzumi | H01L 27/11565 |
| 9,824,966 | B1* | 11/2017 | Kanakamedala | H01L 27/11573 |
| 10,073,643 | B2* | 9/2018 | Jung | G06F 3/0658 |
| 10,304,541 | B2* | 5/2019 | Hwang | G11C 16/12 |
| 10,355,007 | B2* | 7/2019 | Costa | H01L 27/1157 |
| 10,720,447 | B2* | 7/2020 | Jang | H01L 29/0649 |
| 10,892,279 | B1* | 1/2021 | Sakotsubo | H01L 27/11582 |
| 11,024,638 | B2* | 6/2021 | Shim | H01L 27/1157 |
| 11,444,098 | B2* | 9/2022 | Son | H01L 23/5226 |
| 2016/0071763 | A1* | 3/2016 | Sho | H01L 21/76838 438/637 |
| 2016/0163389 | A1 | 6/2016 | Zhang et al. | |
| 2017/0076808 | A1 | 3/2017 | Sakui | |
| 2018/0122821 | A1* | 5/2018 | Kim | H01L 21/02356 |
| 2018/0294270 | A1* | 10/2018 | Lee | H01L 27/11565 |
| 2022/0254798 | A1* | 8/2022 | Said | H01L 27/11556 |

OTHER PUBLICATIONS

Office Action dated Feb. 25, 2022 in Taiwanese Application No. 110122808.

\* cited by examiner

FIG. 18C
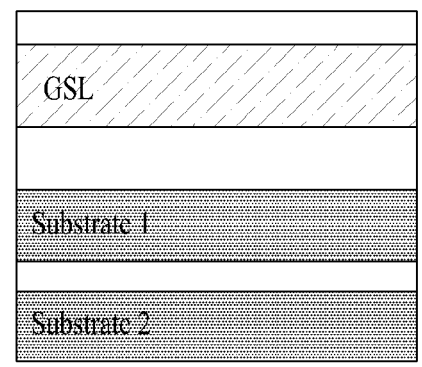
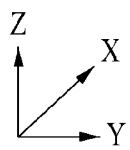

FIG. 18E
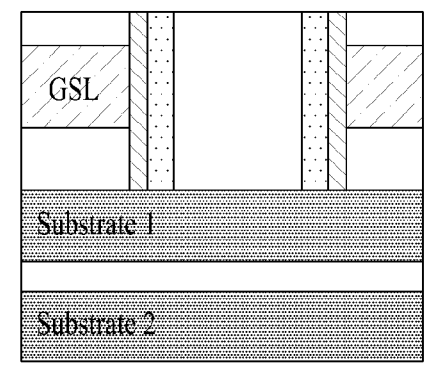
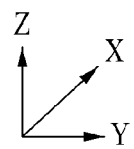

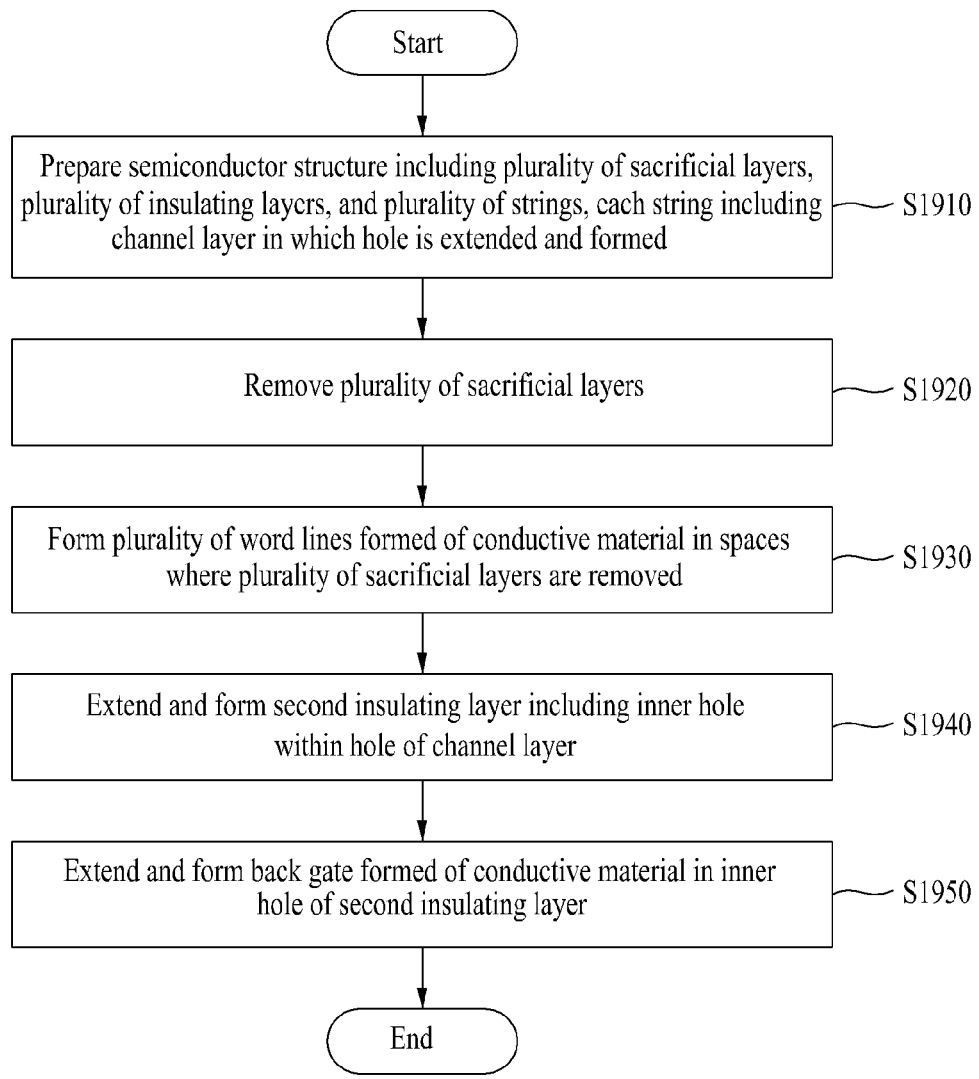

THREE-DIMENSIONAL FLASH MEMORY WITH BACK GATE

CROSS-REFERENCE TO RELATED APPLICATIONS

A claim for priority under 35 U.S.C. § 119 is made to Korean Patent Application No. 10-2020-0076115 filed on Jun. 23, 2020, Korean Patent Application No. 10-2020-0096526 filed on Aug. 3, 2020, Korean Patent Application No. 10-2020-0132388 filed on Oct. 14, 2020, in the Korean Intellectual Property Office, the entire contents of which are hereby incorporated by reference.

BACKGROUND

Embodiments of the inventive concept described herein relate to a three-dimensional flash memory, and more particularly, relate to a three-dimensional flash memory capable of improving a cell characteristic and reliability and an operating method thereof.

A flash memory device that is an electrically erasable programmable read only memory (EEPROM) may be used in common, for example, in a computer, a digital camera, an MP3 player, a game system, a memory stick, etc. The flash memory device electrically programs/erases data by using the F-N (Fowler-Nordheim) tunneling or the hot electron injection.

In detail, referring to FIG. 1 showing an array of a conventional three-dimensional flash memory, the array of the three-dimensional flash memory may include a common source line CSL, a bit line BL, and a plurality of cell strings CSTR interposed between the common source line CSL and the bit line BL.

Bit lines are arranged two-dimensionally, and a plurality of cell strings CSTR are connected in parallel with each of the bit lines. The cell strings CSTR may be connected in common with the common source line CSL. That is, a plurality of cell strings CSTR may be disposed between a plurality of bit lines and one common source line CSL. In this case, the common source line CSL may include a plurality of common source lines, and the plurality of common source lines CSL may be two-dimensionally arranged. Here, the same voltage may be electrically applied to the plurality of common source lines CSL, or the plurality of common source lines CSL may be electrically controlled independently of each other.

Each of the cell strings CSTR may include a ground selection transistor GST connected with the common source line CSL, a string selection transistor SST connected with the bit line BL, and a plurality of memory cell transistors MCT interposed between the ground selection transistor GST and the string selection transistor SST. In each cell string CSTR, the ground selection transistor GST, the string selection transistor SST, and the memory cell transistors MCT may be connected in series.

The common source line CSL may be connected in common sources of the ground selection transistors GST. In addition, a ground selection line GSL, a plurality of word lines WL0 to WL3, and a plurality of string selection lines SSL, which are disposed between the common source line CSL and the bit line BL, may be respectively used as gate layers of the ground selection transistors GST, the memory cell transistors MCT, and the string selection transistors SST. Also, each of the memory cell transistors MCT includes a memory element. Below, the string selection line SSL may be expressed as an upper selection line USL, and the ground selection line GSL may be expressed as a lower selection line LSL.

Meanwhile, a conventional three-dimensional flash memory may increase the degree of integration by vertically stacking cells to satisfy requirements of a consumer such as an excellent performance and a low price.

For example, referring to FIG. 2 showing a structure of a conventional three-dimensional flash memory, the conventional three-dimensional flash memory is manufactured by arranging electrode structures 215 in which interlayer insulating layers 211 and horizontal structures 250 are formed alternately and repeatedly on a substrate 200. The interlayer insulating layers 211 and the horizontal structures 250 may be extended in a first direction. The interlayer insulating layers 211 may be, for example, a silicon oxide layer, and the lowest interlayer insulating layer 211a of the interlayer insulating layers 211 may be smaller in thickness than the remaining interlayer insulating layers 211. Each of the horizontal structures 250 may include a first blocking insulating layer 242, a second blocking insulating layer 243, and an electrode layer 245. The conventional three-dimensional flash memory may include a plurality of electrode structures 215, and the plurality of electrode structures 215 may be arranged to face each other in a second direction intersecting the first direction. The first direction and the second direction may correspond to an x-axis and a y-axis of FIG. 2, respectively. Trenches 240 may be extended in the first direction such that the plurality of electrode structures 215 are spaced from each other. Impurity regions doped with impurities of a high concentration may be formed in the substrate 200 exposed by the trenches 240 such that the common source line CSL is disposed. Although not illustrated, device isolation layers filling the trenches 240 may be further disposed.

Vertical structures 230 penetrating the electrode structures 215 may be disposed. For example, in a plan view, the vertical structures 230 may be aligned along the first and second directions so as to be disposed in a matrix form. For another example, the vertical structures 230 may be aligned in the second direction and may be arranged in the first direction in a zig-zag form. Each of the vertical structures 230 may include a protection layer 224, a charge storage layer 225, a tunnel insulating layer 226, and a channel layer 227. For example, the channel layer 227 may be formed in the form of a hallow tube; in this case, a buried layer 228 filling the inside of the channel layer 227 may be further formed. A drain region "D" may be disposed over the channel layer 227, and a conductive pattern 229 may be formed on the drain region "D" so as to be connected with the bit line BL. The bit line BL may be extended in a direction intersecting the horizontal structure 250, for example, the second direction. For example, the vertical structures 230 aligned in the second direction may be connected with one bit line BL.

The first and second blocking insulating layers 242 and 243 included in the horizontal structure 250 and the charge storage layer 225 and the tunnel insulating layer 226 included in the vertical structure 230 may be defined as an oxide-nitride-oxide (ONO) layer being an information storage element. That is, a portion of the information storage element may be included in the vertical structure 230, and the remaining portion thereof may be included in the horizontal structure 250. For example, the charge storage layer 225 and the tunnel insulating layer 226 of the information storage element may be included in the vertical structure 230, and the first and second blocking insulating layers 242 and 243 may be included in the horizontal structure 250.

Epitaxial patterns 222 may be disposed between the substrate 200 and the vertical structures 230. The epitaxial patterns 222 connect the substrate 200 and the vertical structures 230. The epitaxial patterns 222 may be in contact with the horizontal structures 250 in at least one layer. That is, the epitaxial patterns 222 may be disposed to be in contact with the lowest horizontal structure 250a. According to another embodiment, the epitaxial patterns 222 may be disposed to be in contact with the horizontal structures 250 in a plurality of layers, for example, two layers. Meanwhile, in the case where the epitaxial patterns 222 are disposed to be in contact with the lowest horizontal structure 250a, the lowest horizontal structure 250a may be greater in thickness than the remaining horizontal structures 250. The lowest horizontal structure 250a being in contact with the epitaxial patterns 222 may correspond to the ground selection line GSL of the array in the three-dimensional flash memory described with reference to FIG. 1, and the remaining horizontal structures 250 being in contact with the vertical structures 230 may correspond to the plurality of word lines WL0 to WL3, respectively.

Each of the epitaxial patterns 222 includes a recessed side wall 222a. As such, the lowest horizontal structure 250a being in contact with the epitaxial patterns 222 is disposed along a profile of the recessed side wall 222a. That is, the lowest horizontal structure 250a may be disposed to be convex inwardly along the recessed side wall 222a of the epitaxial patterns 222.

In the conventional three-dimensional flash memory having the above structure, as the number of vertical memory cells increases, the cell characteristic and reliability thereof are degraded.

Accordingly, embodiments below are directed to provide a technology for improving a cell characteristic and reliability.

SUMMARY

Embodiments of the inventive concept provide a three-dimensional flash memory with a structure in which a back gate is extended and formed within a channel layer such that a cell characteristic and reliability are improved.

In more detail, embodiments of the inventive concept provide a three-dimensional flash memory including a back gate to which a pass voltage for forming a channel at a channel layer or boosting the channel layer is applied.

According to an embodiment, a three-dimensional flash memory includes a plurality of word lines extended and formed in a horizontal direction on a substrate so as to be sequentially stacked, and a plurality of strings penetrating the plurality of word lines and extended and formed in one direction on the substrate. Each of the plurality of strings includes a channel layer extended and formed in the one direction, and a charge storage layer extended and formed in the one direction to surround the channel layer, the channel layer and the charge storage layer constitute a plurality of memory cells corresponding to the plurality of word lines, and the channel layer includes a back gate extended and formed in the one direction, with at least a portion of the back gate surrounded by the channel layer, and an insulating layer extended and formed in the one direction between the back gate and the channel layer.

According to one aspect, in a program operation associated with a target memory cell, a pass voltage for forming a channel at the channel layer or boosting the channel layer may be applied to the back gate.

According to another aspect, the channel layer included in a selected string corresponding to the target memory cell from among the plurality of strings may form a channel for a program operation for the target memory cell when a ground voltage is applied to a bit line of the selected string, a program voltage is applied to a word line corresponding to the target memory cell from among the plurality of word lines, and word lines corresponding to remaining memory cells other than the target memory cell from among the plurality of word lines are floated in a state where the pass voltage is applied to the back gate.

According to another aspect, the channel layer included in an unselected string not corresponding to the target memory cell from among the plurality of strings may be boosted when the pass voltage is applied to the back gate in a state where the unselected string itself is floated as a power supply voltage is applied to a bit line of the unselected string, the power supply voltage is applied to a string selection line (SSL) of the unselected string, thereby preventing memory cells included in the unselected string from being programmed by a program voltage for the target memory cell.

According to another aspect, a region of the insulating layer, which corresponds to a ground selection line (GSL) located under the plurality of word lines, or a region of the channel layer, which corresponds to the GSL, may have a structure for preventing a leakage current at the GSL.

According to another aspect, the back gate may be extended and formed across an inner region of the channel layer corresponding to the plurality of word lines.

According to another aspect, the back gate may penetrate the substrate where the plurality of strings are extended and formed and may be extended and formed to a substrate for the back gate located under the substrate where the plurality of strings are extended and formed, and the substrate for the back gate may be used for heat dissipation of the plurality of strings.

According to another aspect, a wire for a voltage to be applied to the back gate may be formed on one of an upper surface or a lower surface of a substrate for the back gate.

According to another aspect, the back gate may penetrate the substrate where the plurality of strings are extended and formed and may be extended and formed to a back gate plate disposed in the horizontal direction under the substrate where the plurality of strings are extended and formed, and the back gate plate may alleviate a film stress of the plurality of word lines between the plurality of word lines and the substrate such that a warpage of the substrate is prevented.

According to another aspect, in a read operation associated with the plurality of memory cells, a program enhanced voltage for increasing threshold voltages of the plurality of memory cells such that a program speed of the plurality of memory cells is improved may be applied to the back gate.

According to another aspect, in an erase operation, an erase voltage for memory cells included in the plurality of strings may be applied to the back gate.

According to another aspect, in a program operation associated with a target memory cell, a program enhanced voltage for forming an inversion at the channel layer in the program operation and improving a program speed of the target memory cell may be applied to the back gate.

According to another aspect, in an erase operation, voltages for performing the erase operation for memory cells included in the plurality of strings in two steps may be applied to the back gate.

According to another aspect, in a first step of the erase operation, a ground voltage for hole generation when the plurality of word lines are floated may be applied to the back gate. In a second step of the erase operation, the back gate may be floated for hole injection when the ground voltage is applied to the plurality of word lines.

According to another aspect, the channel layer may have a structure of being segmented by the back gate.

According to an embodiment, a method for manufacturing a three-dimensional flash memory includes preparing a semiconductor structure including a plurality of word lines extended and formed in a horizontal direction on a substrate so as to be sequentially stacked, a plurality of insulating layers alternately stacked between the plurality of word lines, and a plurality of strings penetrating the plurality of word lines and extended and formed in one direction on the substrate, wherein each of the plurality of strings includes a channel layer extended and formed in the one direction, and a charge storage layer extended and formed in the one direction to surround the channel layer, and wherein a hole is extended and formed at the channel layer in the one direction in the semiconductor structure; extending and forming an insulating layer including an inner hole within the hole in the one direction; and extending and forming the back gate formed of a conductive material in the inner hole of the insulating layer in the one direction.

According to one aspect, a pass voltage for forming a channel at the channel layer or boosting the channel layer may be applied to the back gate.

According to another aspect, the inner hole of the channel layer may penetrate the substrate where the plurality of strings are extended and formed and may be extended and formed to a substrate for the back gate located under the substrate where the plurality of strings are extended and formed.

According to another embodiment, a three-dimensional flash manufacturing method includes preparing a semiconductor structure including a plurality of word lines extended and formed in a horizontal direction on a substrate so as to be sequentially stacked, a plurality of insulating layers alternately stacked between the plurality of word lines, and a plurality of strings penetrating the plurality of word lines and extended and formed in one direction on the substrate, wherein each of the plurality of strings includes a channel layer extended and formed in the one direction, and a charge storage layer extended and formed in the one direction to surround the channel layer, and wherein a hole is extended and formed at the channel layer in the semiconductor structure, and wherein a first insulating layer is formed in a region, which corresponds to a ground selection line (GSL), of an inner wall of the hole; extending and forming a second insulating layer including an inner hole within the hole in the one direction; and extending and forming a back gate formed of a conductive material in the inner hole of the second insulating layer in the one direction.

According to another embodiment, a three-dimensional flash manufacturing method includes preparing a semiconductor structure including a plurality of word lines extended and formed in a horizontal direction on a substrate so as to be sequentially stacked, a plurality of insulating layers alternately stacked between the plurality of word lines, and a plurality of strings penetrating the plurality of word lines and extended and formed in one direction on the substrate, wherein each of the plurality of strings includes a channel layer extended and formed in the one direction, and a charge storage layer extended and formed in the one direction to surround the channel layer; extending and forming a first hole at the channel layer in the one direction in the semiconductor structure; extending and forming an insulating layer within the first hole in the one direction; extending and forming a second hole at the insulating layer in the one direction; and extending and forming a back gate formed of a conductive material in the second hole in the one direction.

According to another embodiment, a method for manufacturing a three-dimensional flash memory includes preparing a semiconductor structure including a plurality of sacrificial layers extended and formed in a horizontal direction on a substrate so as to be sequentially stacked, a plurality of insulating layers alternately stacked between the plurality of sacrificial layers, and a plurality of strings penetrating the plurality of sacrificial layers and extended and formed in one direction on the substrate, wherein each of the plurality of strings includes a channel layer extended and formed in the one direction, and a charge storage layer extended and formed in the one direction to surround the channel layer, and wherein a hole is extended and formed at the channel layer in the semiconductor structure; removing the plurality of sacrificial layers through the hole of the channel layer; forming a plurality of word lines formed of a conductive material in spaces where the plurality of sacrificial layers are removed; extending and forming an insulating layer including an inner hole within the hole in the one direction; and extending and forming the back gate formed of a conductive material in the inner hole of the insulating layer in the one direction.

According to one aspect, the method may further include forming a wire for a voltage to be applied to the back gate at a partial region, which corresponds to the back gate, of an upper surface of each of the plurality of strings; and forming a bit line of each of the plurality of strings at a partial region, which corresponds to the channel layer, of the upper surface of each of the plurality of strings.

According to another embodiment, a three-dimensional flash manufacturing method includes preparing a lower semiconductor structure including a plurality of lower word lines extended and formed in a horizontal direction on a substrate so as to be sequentially stacked, a plurality of lower insulating layers alternately stacked between the plurality of lower word lines, and a plurality of lower strings penetrating the plurality of lower word lines and extended and formed in one direction on the substrate, wherein each of the plurality of lower strings includes a lower channel layer extended and formed in the one direction, and a lower charge storage layer extended and formed in the one direction to surround the lower channel layer, and wherein the lower channel layer includes a lower back gate extended and formed in the one direction, with at least a portion thereof surrounded by the lower channel layer, and a lower insulating layer extended and formed in the one direction between the lower back gate and the lower channel layer; preparing an upper semiconductor structure including a plurality of upper word lines sequentially stacked, a plurality of upper insulating layers alternately stacked between the plurality of upper word lines, and a plurality of upper strings penetrating the plurality of upper word lines and extended and formed in the one direction, wherein each of the plurality of upper strings includes an upper channel layer extended and formed in the one direction, and an upper charge storage layer extended and formed in the one direction to surround the upper channel layer, and wherein the upper channel layer includes an upper back gate extended and formed in the one direction, with at least a portion thereof surrounded by the upper channel layer, and an upper insulating layer extended and formed in the one direction between the upper back gate and the upper channel layer; and stacking the upper semiconductor structure on an upper surface of the lower semiconductor structure such that a cross section of the lower back gate and a cross section of the upper back gate coincide with each other.

According to an embodiment, a program operating method of a three-dimensional flash memory which includes a plurality of word lines extended and formed in a horizontal direction on a substrate so as to be sequentially stacked; and a plurality of strings penetrating the plurality of word lines and extended and formed in one direction on the substrate, wherein each of the plurality of strings includes a channel layer extended and formed in the one direction and a charge storage layer extended and formed in the one direction to surround the channel layer, wherein the channel layer and the charge storage layer constitute a plurality of memory cells corresponding to the plurality of word lines, and wherein the channel layer includes a back gate extended and formed in the one direction, with at least a portion thereof surrounded by the channel layer, such that a voltage for forming a channel is capable of being applied to the channel layer, and an insulating layer extended and formed in one direction between the back gate and the channel layer, includes applying a pass voltage for forming a channel at the channel layer or boosting the channel layer, to the back gate; forming a channel for a program operation for a target memory cell at the channel layer included in a selected string corresponding to the target memory cell to be programmed from among the plurality of strings, by applying a ground voltage to a bit line of the selected string, applying a program voltage to a word line corresponding to the target memory cell from among the plurality of word lines, and floating word lines corresponding to remaining memory cells other than the target memory cell from among the plurality of word lines in a state where a pass voltage is applied to the back gate; and boosting a channel layer included in an unselected string not corresponding to the target memory cell from among the plurality of strings, by applying the pass voltage to the back gate in a state where the unselected string itself is floated when a power supply voltage is applied to a bit line of the unselected string and the power supply voltage is applied to a string selection line (SSL) of the unselected string, thereby preventing memory cells included in the unselected string from being programmed by a program voltage for the target memory cell.

According to an embodiment, a read operating method of a three-dimensional flash memory which includes a plurality of word lines extended and formed in a horizontal direction on a substrate so as to be sequentially stacked; and a plurality of strings penetrating the plurality of word lines and extended and formed in one direction on the substrate, wherein each of the plurality of strings includes a channel layer extended and formed in the one direction and a charge storage layer extended and formed in the one direction to surround the channel layer, wherein the channel layer and the charge storage layer constitute a plurality of memory cells corresponding to the plurality of word lines, and wherein the channel layer includes a back gate extended and formed in the one direction, with at least a portion thereof surrounded by the channel layer, such that a voltage for forming a channel is capable of being applied to the channel layer, and an insulating layer extended and formed in one direction between the back gate and the channel layer, includes applying, to the back gate, a program enhanced voltage for increasing threshold voltages of the plurality of memory cells such that a program speed of the plurality of memory cells is improved; and performing a read operation on a selected string corresponding to a target memory cell to be read from among the plurality of strings, by applying a power supply voltage to a bit line of the selected string, applying a verify voltage to a word line corresponding to the target memory cell from among the plurality of word lines, and applying a pass voltage to word lines corresponding to remaining memory cells other than the target memory cell from among the plurality of word lines.

According to an embodiment, an erase operating method of a three-dimensional flash memory which includes a plurality of word lines extended and formed in a horizontal direction on a substrate so as to be sequentially stacked; and a plurality of strings penetrating the plurality of word lines and extended and formed in one direction on the substrate, wherein each of the plurality of strings includes a channel layer extended and formed in the one direction and a charge storage layer extended and formed in the one direction to surround the channel layer, wherein the channel layer and the charge storage layer constitute a plurality of memory cells corresponding to the plurality of word lines, and wherein the channel layer includes a back gate extended and formed in the one direction, with at least a portion thereof surrounded by the channel layer, such that a voltage for forming a channel is capable of being applied to the channel layer, and an insulating layer extended and formed in one direction between the back gate and the channel layer, includes applying an erase voltage for memory cells included in the plurality of strings to the back gate.

According to another embodiment, a program operating method of a three-dimensional flash memory which includes a plurality of word lines extended and formed in a horizontal direction on a substrate so as to be sequentially stacked; and a plurality of strings penetrating the plurality of word lines and extended and formed in one direction on the substrate, wherein each of the plurality of strings includes a channel layer extended and formed in the one direction and a charge storage layer extended and formed in the one direction to surround the channel layer, wherein the channel layer and the charge storage layer constitute a plurality of memory cells corresponding to the plurality of word lines, and wherein the channel layer includes a back gate extended and formed in the one direction, with at least a portion thereof surrounded by the channel layer, such that a voltage for forming a channel is capable of being applied to the channel layer, and an insulating layer extended and formed in one direction between the back gate and the channel layer, includes applying, to the back gate, a program enhanced voltage for improving a program speed of a target memory cell to be programmed; applying a pass voltage to remaining word lines other than a word line corresponding to the target memory cell from among the plurality of word lines; and forming an inversion at a channel layer included in a selected string corresponding to the target memory cell from among the plurality of strings by applying a program enhanced voltage to the back gate.

According to another embodiment, an erase operating method of a three-dimensional flash memory which includes a plurality of word lines extended and formed in a horizontal direction on a substrate so as to be sequentially stacked; and a plurality of strings penetrating the plurality of word lines and extended and formed in one direction on the substrate, wherein each of the plurality of strings includes a channel layer extended and formed in the one direction and a charge storage layer extended and formed in the one direction to surround the channel layer, wherein the channel layer and the charge storage layer constitute a plurality of memory cells corresponding to the plurality of word lines, and wherein the channel layer includes a back gate extended and formed in the one direction, with at least a portion thereof surrounded by the channel layer, such that a voltage for forming a channel is capable of being applied to the channel layer, and an insulating layer extended and formed in one direction between the back gate and the channel layer, includes applying, to the back gate, a ground voltage for hole generation when the plurality of word lines are floated, in a first step of an erase operation; and floating the back gate for hole injection when a ground voltage is applied to the plurality of word lines, in a second step of the erase operation.

BRIEF DESCRIPTION OF THE FIGURES

The above and other objects and features will become apparent from the following description with reference to the following figures, wherein like reference numerals refer to like parts throughout the various figures unless otherwise specified, and wherein:

FIGS. 18A to 18K are Y-Z cross-sectional views for describing an implementation example of a three-dimensional flash memory manufacturing method illustrated in FIG. 17;

FIG. 19 is a flowchart illustrating a three-dimensional flash memory manufacturing method according to another embodiment;

DETAILED DESCRIPTION

Figure 1:
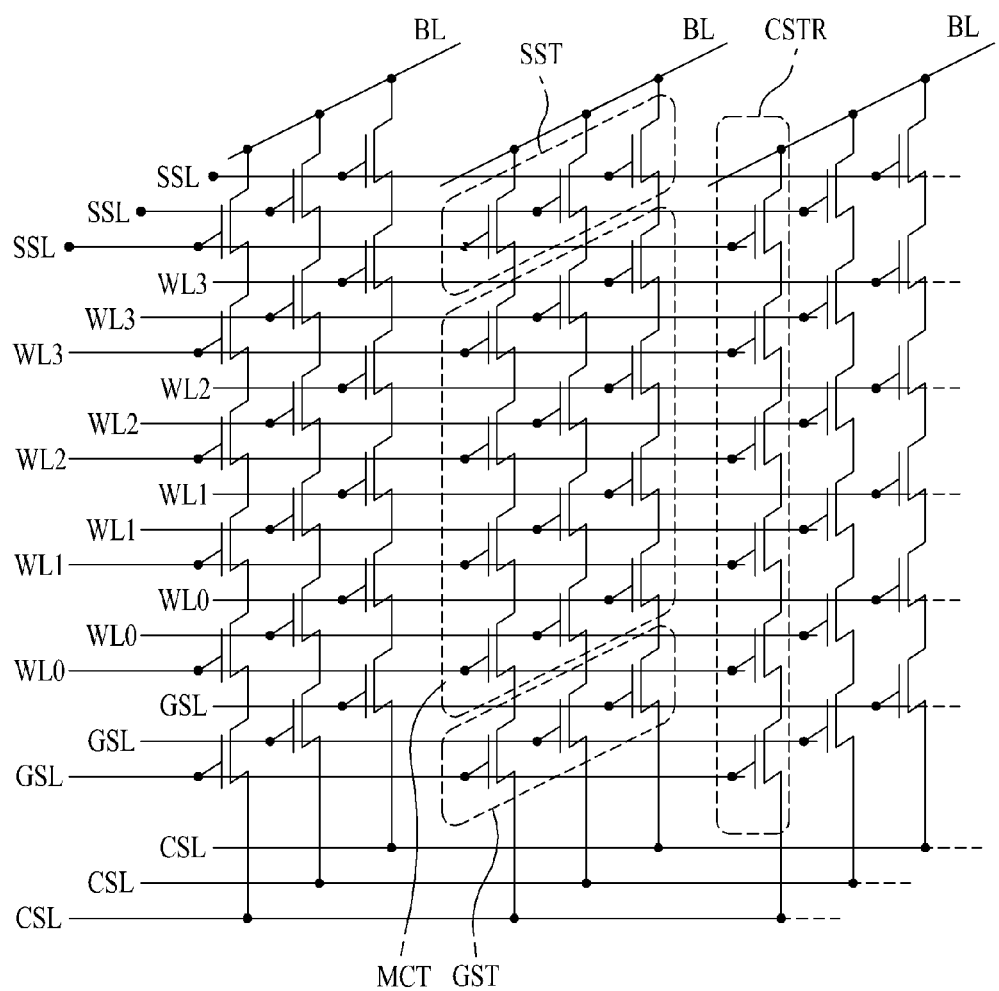
FIG. 1 is a circuit diagram illustrating an array of a conventional three-dimensional flash memory.

Hereinafter, embodiments will be described in detail with reference to the accompanying drawings. However, the inventive concept are not limited or restricted by the embodiments. Further, the same reference signs/numerals in the drawings denote the same members.

Furthermore, the terminologies used herein are used to properly express the embodiments of the inventive concept, and may be changed according to the intentions of the user or the manager or the custom in the field to which the inventive concept pertains. Accordingly, definition of the terms should be made according to the overall disclosure set forth herein.

Figure 2:
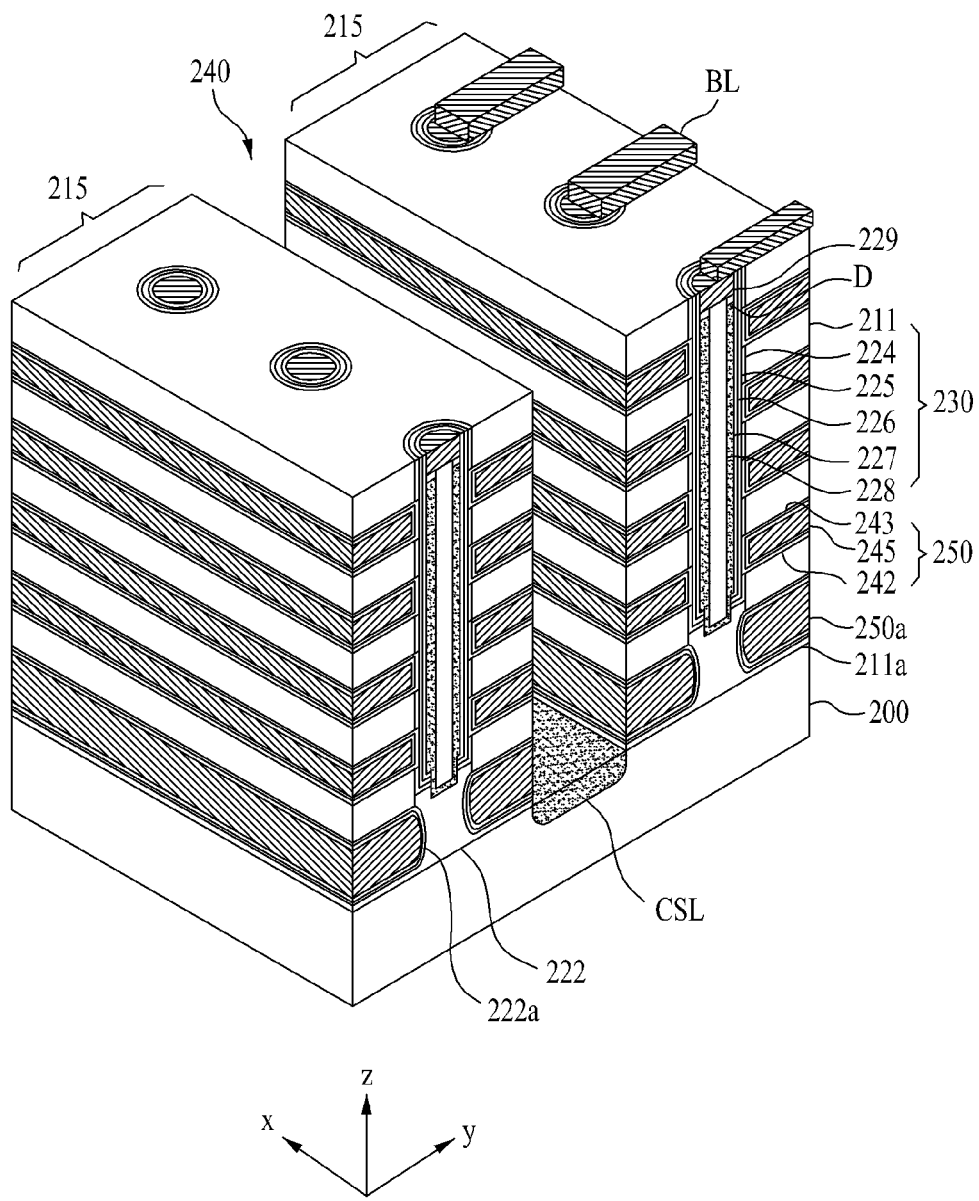
FIG. 2 is a perspective view illustrating a structure of a conventional three-dimensional flash memory.

Hereinafter, in a Y-Z cross-sectional view showing a three-dimensional flash memory, the three-dimensional flash memory will be illustrated and described under the assumption that components such as a bit line located above a plurality of strings and a source line located below the plurality of strings are omitted for convenience of description. However, the three-dimensional flash memory to be described below is not limited thereto. For example, the three-dimensional flash memory may further include additional components based on the structure of the conventional three-dimensional flash memory described with reference to FIG. 2.

Figure 3A:
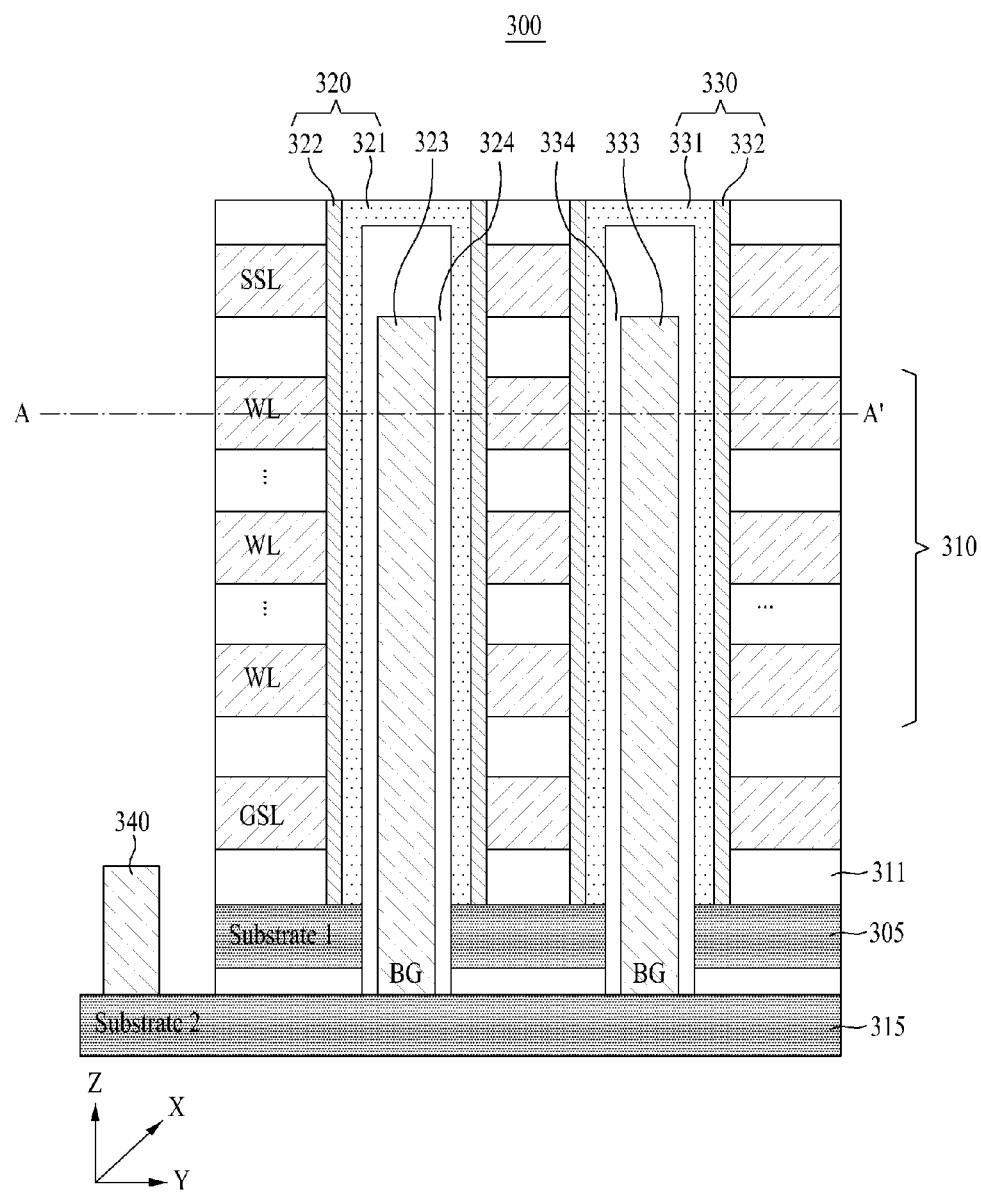
FIG. 3A is a Y-Z cross-sectional view illustrating a three-dimensional flash memory according to an embodiment.
Figure 3B:
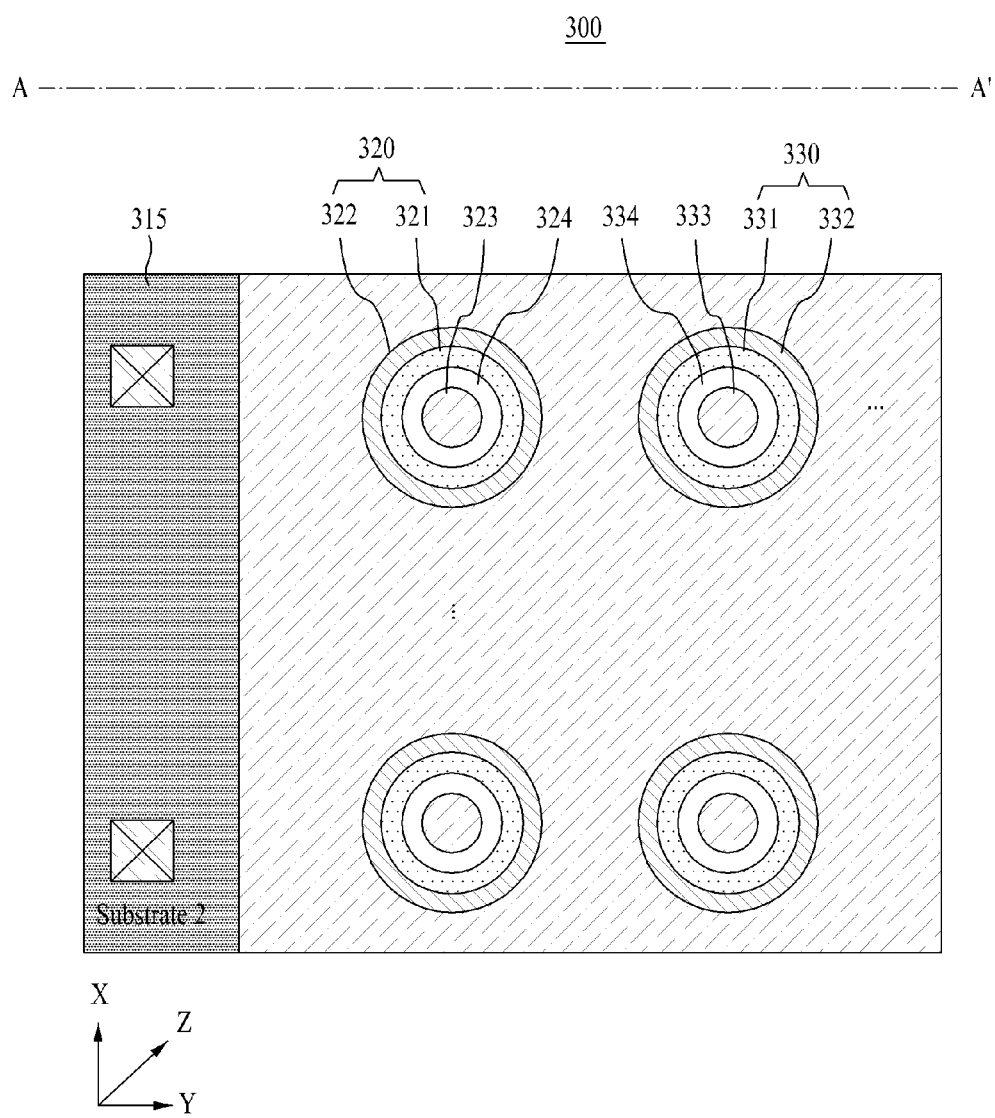
FIG. 3B is an X-Y plan view illustrating a cross-section of a three-dimensional flash memory taken along line A-A' of FIG. 3A.
Figure 4A:
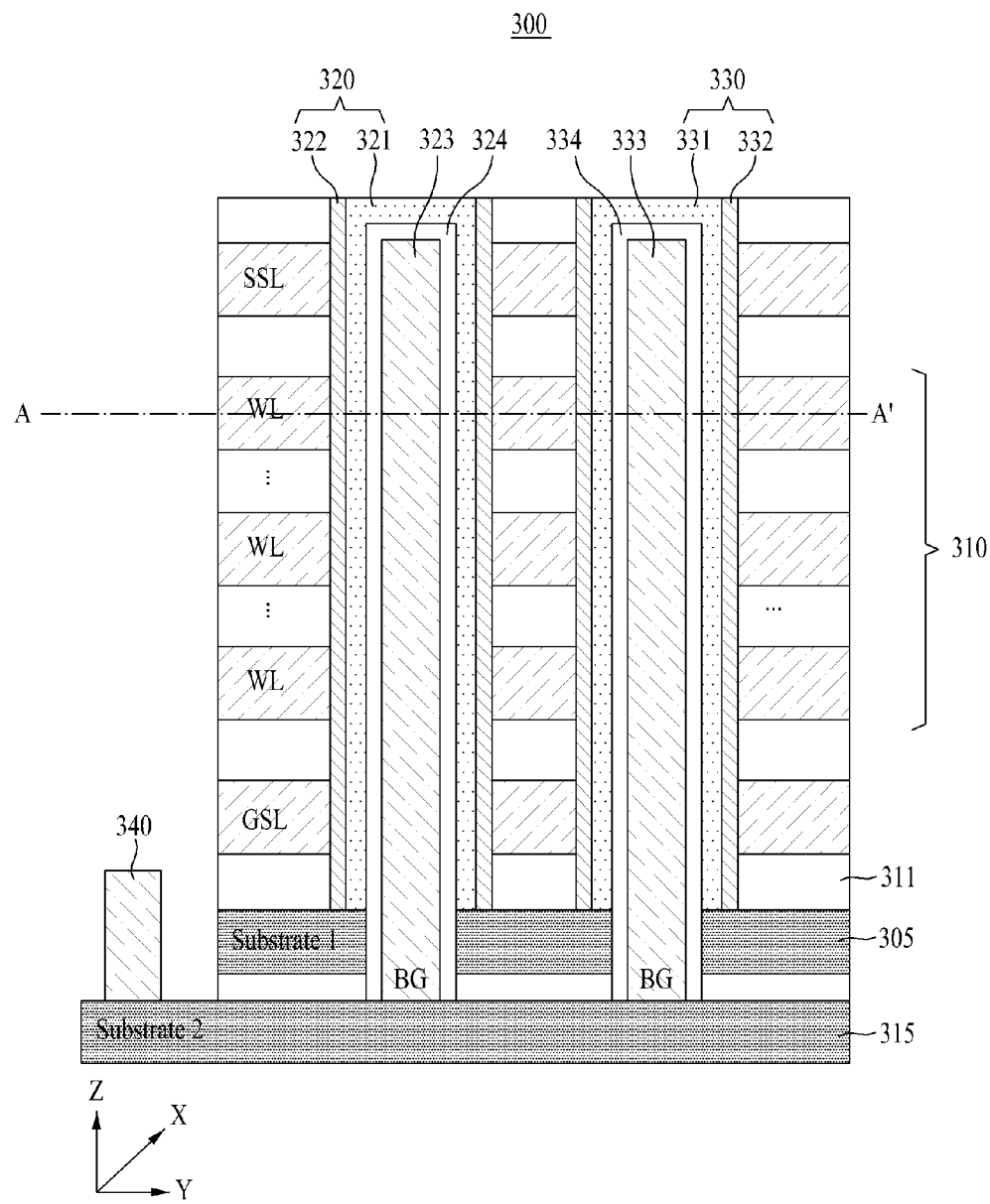
FIGS. 4A to 4D are Y-Z cross-sectional views illustrating other implementation examples of a three-dimensional flash memory according to an embodiment.
Figure 4B:
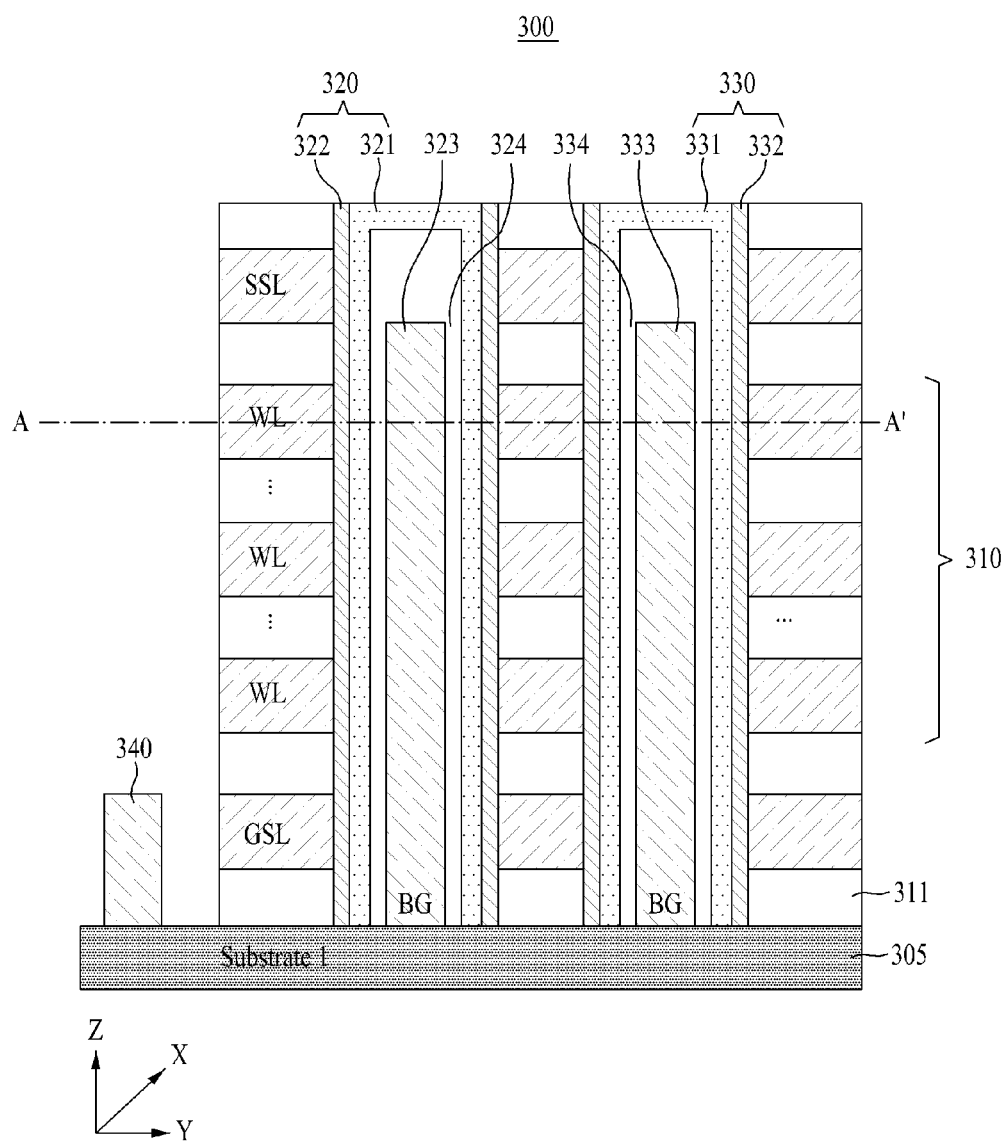
Figure 4C:
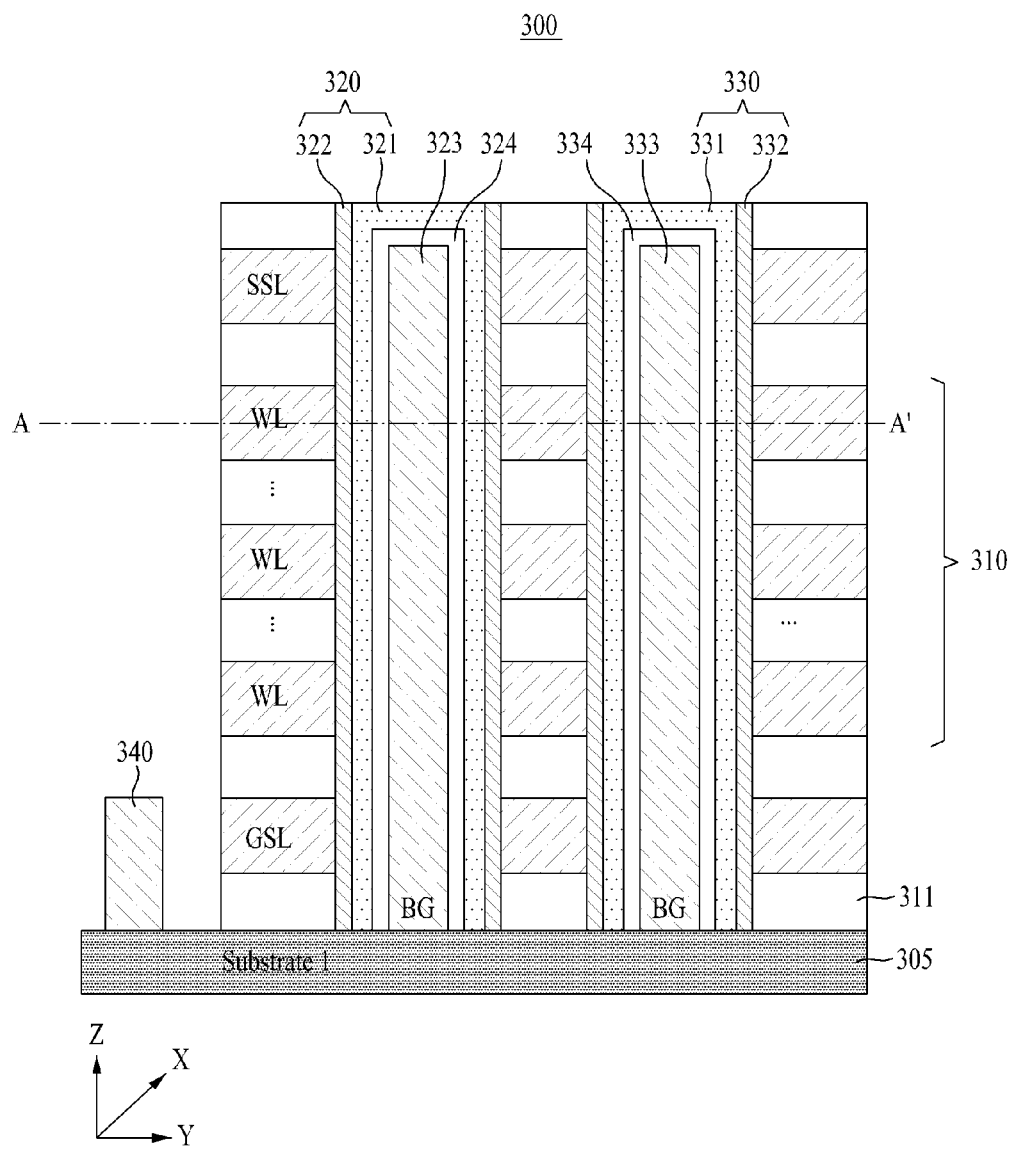
Figure 4D:
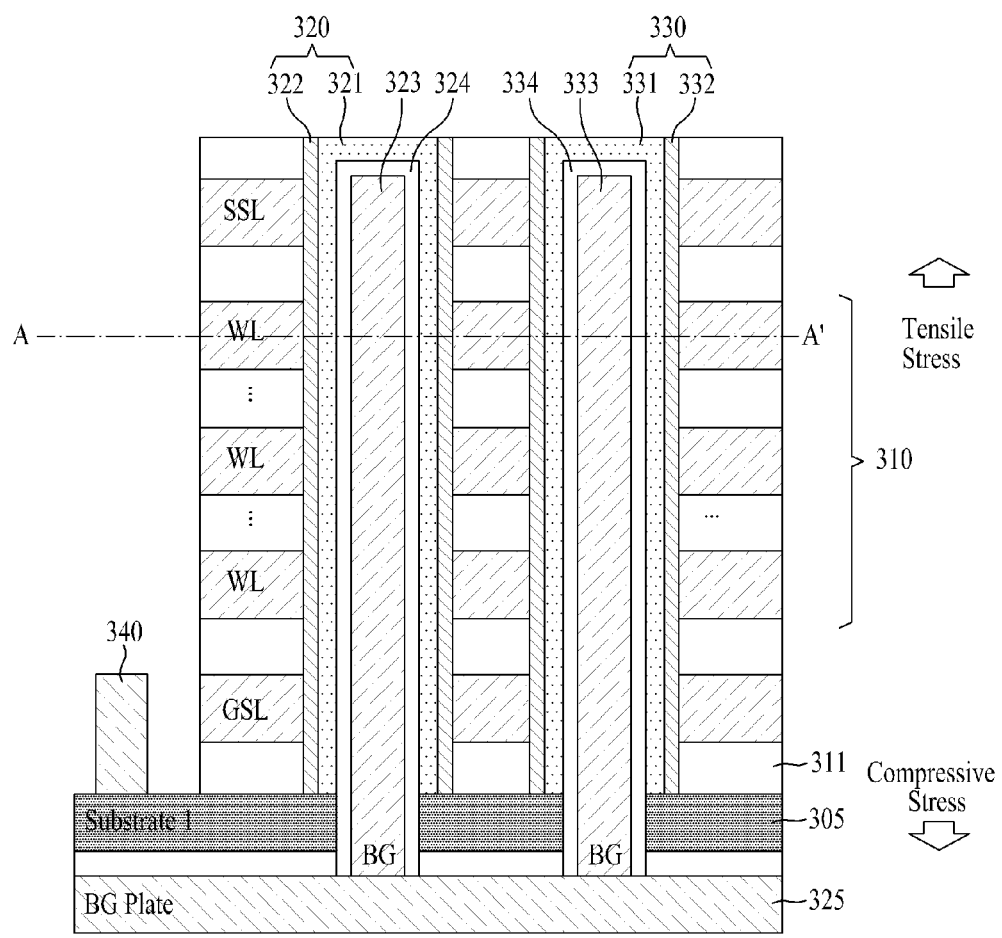
Figure 5A:
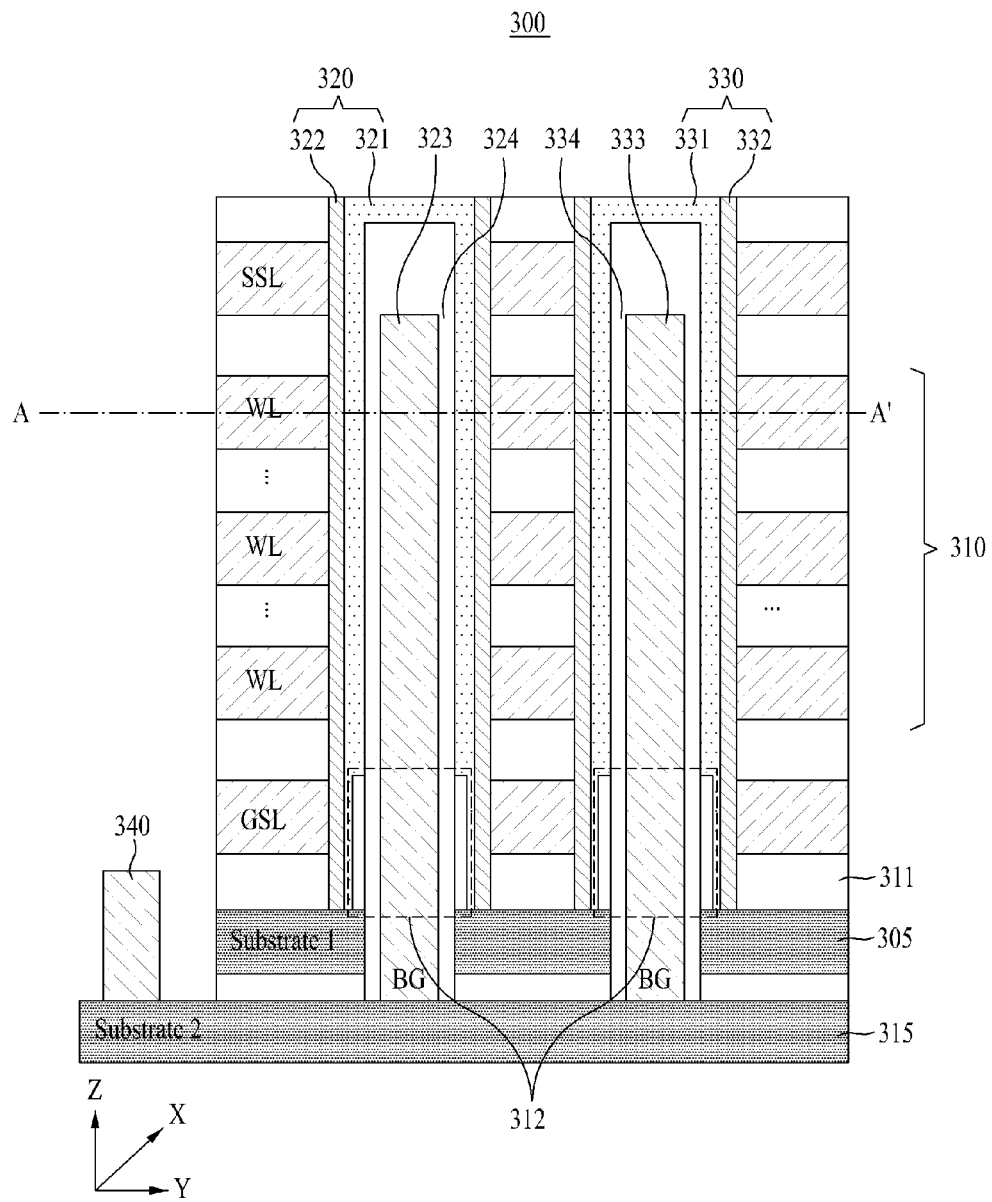
FIGS. 5A and 5B are Y-Z cross-sectional views illustrating a three-dimensional flash memory according to another embodiment.
Figure 5B:
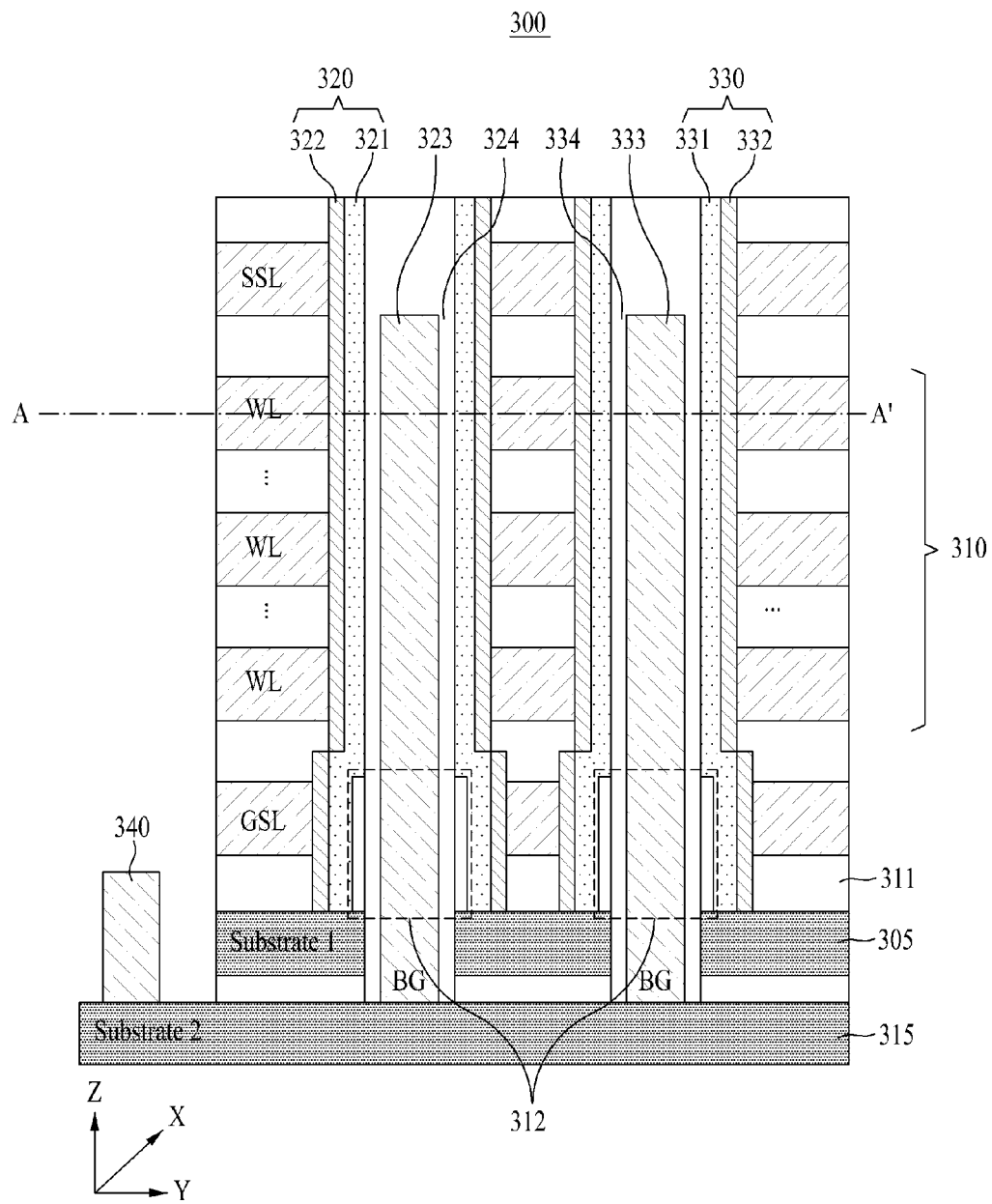

FIG. 3A is a Y-Z cross-sectional view illustrating a three-dimensional flash memory according to an embodiment, FIG. 3B is an X-Y plan view illustrating a cross-section of a three-dimensional flash memory taken along line A-A' of FIG. 3A, FIGS. 4A to 4D are Y-Z cross-sectional views illustrating other implementation examples of a three-dimensional flash memory according to an embodiment, and FIGS. 5A and 5B are Y-Z cross-sectional views illustrating a three-dimensional flash memory according to another embodiment.

Referring to FIGS. 3A and 3B, a three-dimensional flash memory 300 according to an embodiment includes a plurality of word lines 310 and a plurality of strings 320 and 330.

The plurality of word lines 310 may be sequentially stacked on a substrate 305 in a state of being extended and formed in a horizontal direction (e.g., a Y-axis direction), and each of the word lines 310 may be formed of a conductive material, such as tungsten (W), titanium (Ti), tantalum (Ta), copper (Cu), molybdenum (Mo), ruthenium (Ru), or gold (Au), (in addition to the described metallic material, including all metallic materials capable of forming an ALD). A memory operation (e.g., a read operation, a program operation, or an erase operation) may be performed by applying voltages to memory cells respectively corresponding to the word lines 310. A plurality of insulating layers 311 may be interposed between the plurality of word lines 310.

A string selection line SSL may be disposed over the plurality of word lines 310, and a ground selection line GSL may be disposed under the plurality of word lines 310.

The plurality of strings 320 and 330 may penetrate the plurality of word lines 310 so as to be extended and formed in one direction (e.g., a Z-axis direction) on the substrate 305; the strings 320 and 330 may include channel layers 321 and 331 and charge storage layers 322 and 332 to constitute a plurality of memory cells corresponding to the plurality of word lines 310.

The charge storage layers 322 and 332 may be extended and formed to surround the channel layers 321 and 331. The charge storage layers 322 and 332 may correspond to a component that traps charges or holes generated by voltages applied through the plurality of word lines 310 or maintains a state of charges (e.g., a polarization state of charges). That is, the charge storage layers 322 and 332 may be used as data storage in the three-dimensional flash memory 300. For example, an oxide-nitride-oxide (ONO) layer or a ferroelectric layer may be used as the charge storage layers 322 and 332.

The channel layers 321 and 331 may correspond to a component for performing the memory operation by voltages applied through the plurality of word lines 310, the string selection line SSL, the ground selection line GSL, and a bit line and may be formed of single-crystal (or monocrystalline) silicon or poly (or polycrystalline) silicon. Also, the channel layers 321 and 331 may perform the memory operation by a voltage applied to back gates 323 and 333 to be described later. This will be described in detail below.

The channel layers 321 and 331 include the back gates 323 and 333 that are extended and formed in one direction (e.g., the Z-axis direction), with at least a portion thereof surrounded by the channel layers 321 and 331, and insulating layers 324 and 334 extended and formed in one direction between the back gates 323 and 333 and the channel layers 321 and 331. Below, the expression that the back gates 323 and 333 are at least partially surrounded by the channel layers 321 and 331 includes the expression that the back gates 323 and 333 are at least partially included in the channel layers 321 and 331 or penetrate the channel layers 321 and 331.

Here, the channel layers 321 and 331 may have a structure for preventing a leakage current at the ground selection line GSL. For example, according to the structure, the amount of boron of regions of the channel layers 321 and 331, which correspond to the ground selection line GSL, may be more than the amount of boron (B) of regions of the channel layers 321 and 331, which correspond to the ground selection line GSL disposed under the plurality of word lines 310. As such, a threshold voltage of the corresponding regions may increase.

The back gates 323 and 333 may be formed of a conductive material, such as tungsten (W), titanium (Ti), tantalum (Ta), copper (Cu), molybdenum (Mo), ruthenium (Ru), or gold (Au), (in addition to the described metallic material, including all metallic materials capable of forming an ALD), or doped poly silicon such that a voltage is capable of being applied to the channel layers 321 and 331. The back gates 323 and 333 may be extended and formed at the channel layers 321 and 331 across an inner region corresponding to the plurality of word lines 310 (i.e., a region from the ground selection line GSL to the plurality of word lines 310). However, embodiments are not limited thereto. For example, as illustrated in FIG. 4A, the back gates 323 and 333 may be extended and formed at the channel layers 321 and 331 across a corresponding inner region from GSL to SSL.

Also, the back gates 323 and 333 may be extended and formed to a substrate 315 for the back gates 323 and 333, which is located under the substrate 305, in a state of penetrating the substrate 305 where the plurality of strings 320 and 330 are extended and formed. That is, the three-dimensional flash memory 300 including the back gates 323 and 333 may have a dual substrate structure.

In the dual substrate structure, the substrate 315 located under the substrate 305 may be used for heat dissipation of the plurality of strings 320 and 330. As a heat dissipation path of the plurality of strings 320 and 330 is located on the substrate 315 distinguished from the substrate 305 where the plurality of strings 320 and 330 are extended and formed, there may be solved the issue that cell transistors are affected when the heat dissipation path of the plurality of strings 320 and 330 are formed at the substrate 305 where the plurality of strings 320 and 330 are extended and formed.

However, embodiments are not limited thereto. For example, the three-dimensional flash memory 300 including the back gates 323 and 333 may have a single substrate structure as illustrated in FIGS. 4B to 4D. In detail, as illustrated in FIG. 4B, the back gates 323 and 333 may be extended and formed across an inner region (i.e., a region from GSL to the word lines 310) corresponding to the plurality of word lines 310 at the channel layers 321 and 331 on the substrate 305 where the plurality of strings 320 and 330 are formed; alternatively, as illustrated in FIG. 4C, the back gates 323 and 333 may be extended and formed across a corresponding inner region from GSL to SSL at the channel layers 321 and 331 on the substrate 305 where the plurality of strings 320 and 330 are formed.

In the single substrate structure including only the substrate 305 where the plurality of word lines 310 are stacked and the plurality of strings 320 and 330 are extended and formed in one direction, the three-dimensional flash memory 300 including the back gates 323 and 333 may further include a back gate plate 325 disposed under the substrate 305 in a horizontal direction, in a state of penetrating the substrate 305. The back gate plate 325 may be formed of the same material as the back gates 323 and 333 and may alleviate a film stress of the plurality of word lines 310 such that a warpage of the substrate 305 is prevented. In the above structure, the back gates 323 and 333 may be extended and formed to the back gate plate 325.

In both the single substrate structure and the dual substrate structure, a wire 340 for a voltage to be applied to the back gates 323 and 333 may be formed on an upper surface of the substrate 305/315 connected with the back gates 323 and 333, as illustrated in FIG. 4A, 4B, or 4D. However, embodiments are not limited thereto. For example, the wire 340 for a voltage to be applied to the back gates 323 and 333 may be formed on a lower surface of the substrate 305/315 connected with the back gates 323 and 333 (not illustrated) or may be formed over the back gates 323 and 333. This will be described in detail with reference to FIG. 24.

A voltage for an operation of the three-dimensional flash memory 300 may be applied to the back gates 323 and 333. For example, in a program operation, a pass voltage for forming a channel at the channel layer 321/331 or boosting the channel layer 321/331 may be applied to the back gates 323 and 333. In a read operation, a program enhanced voltage for increasing threshold voltages of memory cells may be applied to the back gates 323 and 333 such that a program speed in a program operation to be performed immediately after the read operation is improved. In an erase operation, an erase voltage for memory cells may be applied to the back gates 323 and 333. How to apply the pass voltage for forming a channel at the channel layer 321/331 or boosting the channel layer 321/331 to the back gates 323 and 333 in the program operation will be described in detail with reference to FIGS. 6 and 7; how to apply the program enhanced voltage for increasing threshold voltages of memory cells to the back gates 323 and 333 in the read operation will be described in detail with reference to FIG. 10; and, how to apply the erase voltage for memory cells to the back gates 323 and 333 in the erase operation will be described in detail with reference to FIG. 11.

For another example, a program enhanced voltage for forming an inversion at the channel layers 321 and 331 and improving a program speed in the program operation may be applied to the back gates 323 and 333, and a voltage for performing a two-step erase operation may be applied to the back gates 323 and 333 in the erase operation. How to apply the program enhanced voltage for forming an inversion at the channel layers 321 and 331 and improving a program speed to the back gates 323 and 333 in the program operation will be described in detail with reference to FIGS. 8 and 9, and how to apply the voltage for performing a two-step erase operation to the back gates 323 and 333 in the erase operation will be described in detail with reference to FIGS. 12 and 13.

Also, the back gates 323 and 333 may be utilized in the process of early adjusting threshold voltages of memory cells in units of a block by which the plurality of strings 320 and 330 are grouped, such that the read, program, and erase operations are performed without the influence of a difference between structures of strings belonging to respective blocks. For example, the three-dimensional flash memory 300 may adjust initial threshold voltages of memory cells to be similar or identical to each other, by applying a fine adjustment voltage through the back gates 323 and 333 in consideration of the structure difference such that the compensation for threshold voltages of the memory cells for each block is made. In detail, for example, initial threshold voltages of memory cells of a string included in block A and initial threshold voltages of memory cells of a string included in block B may be identically set by applying a voltage −0.2 V to a back gate included in block A and applying a voltage −0.1 V to a back gate included in block B. A structure where the back gates 323 and 333 are electrically separated from each other in units of block such that different voltages are applied thereto in units of block by which the strings 320 and 330 are grouped is described above, but embodiments are not limited thereto. For example, a structure where the back gates 323 and 333 are electrically separated from each other for each string such that the compensation for initial threshold voltages is made for each string by applying different voltages to the back gates 323 and 333 in units of string may be provided.

The insulating layers 324 and 334 may be formed of an insulating material such that the back gates 323 and 333 are prevented from being directly in contact with the channel layers 321 and 331. In particular, the insulating layers 324 and 334 may have a structure for preventing a leakage current at the ground selection line GSL. For example, regions 312 of the insulating layers 324 and 334, which correspond to the ground selection line GSL disposed under the plurality of word lines 310, may be formed to be thicker than the remaining regions thereof such that a leakage current at the ground selection line GSL is prevented.

A structure where the back gates 323 and 333 and the insulating layers 324 and 334 are formed in inner holes of the channel layers 321 and 331 so as to be tightly surrounded by the channel layers 321 and 331 is described above, but embodiments are not limited thereto. For example, the back gates 323 and 333 and the insulating layers 324 and 334 may be formed to be surrounded only at least partially by the channel layers 321 and 331. This will be described in detail with reference to FIGS. 23A to 23G.

Below, it may be assumed that a memory operation is performed by the three-dimensional flash memory having the structure described with reference to FIGS. 3A and 3B, and the memory operation may be identically applied to the three-dimensional flash memory having the structure described with reference to FIGS. 4A to 4D, 5A, and 5B.

Figure 6:
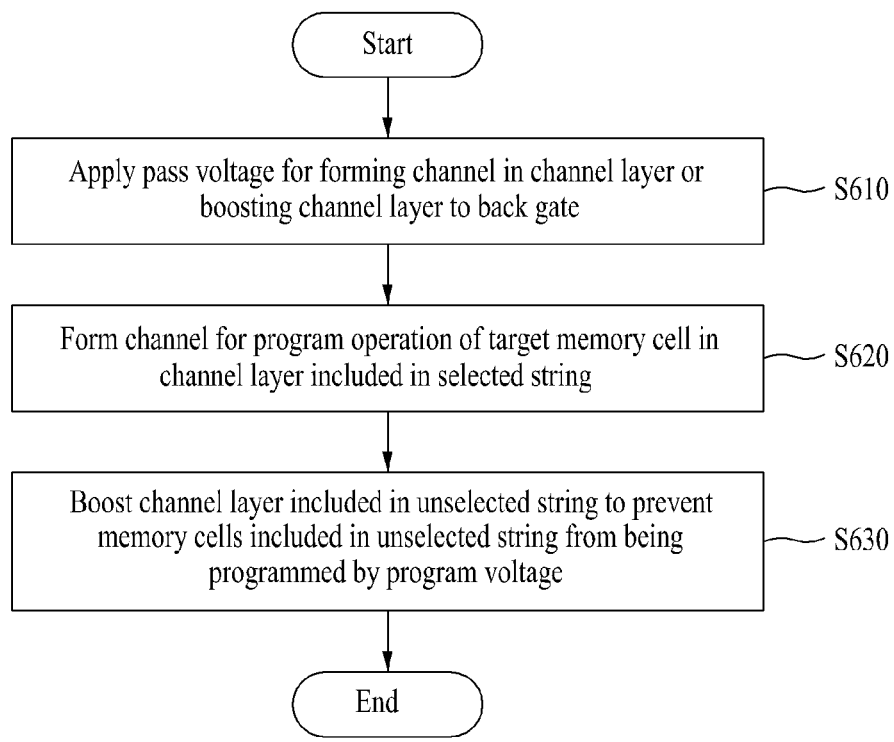
FIG. 6 is a flowchart illustrating a program operation of a three-dimensional flash memory according to an embodiment.
Figure 7:
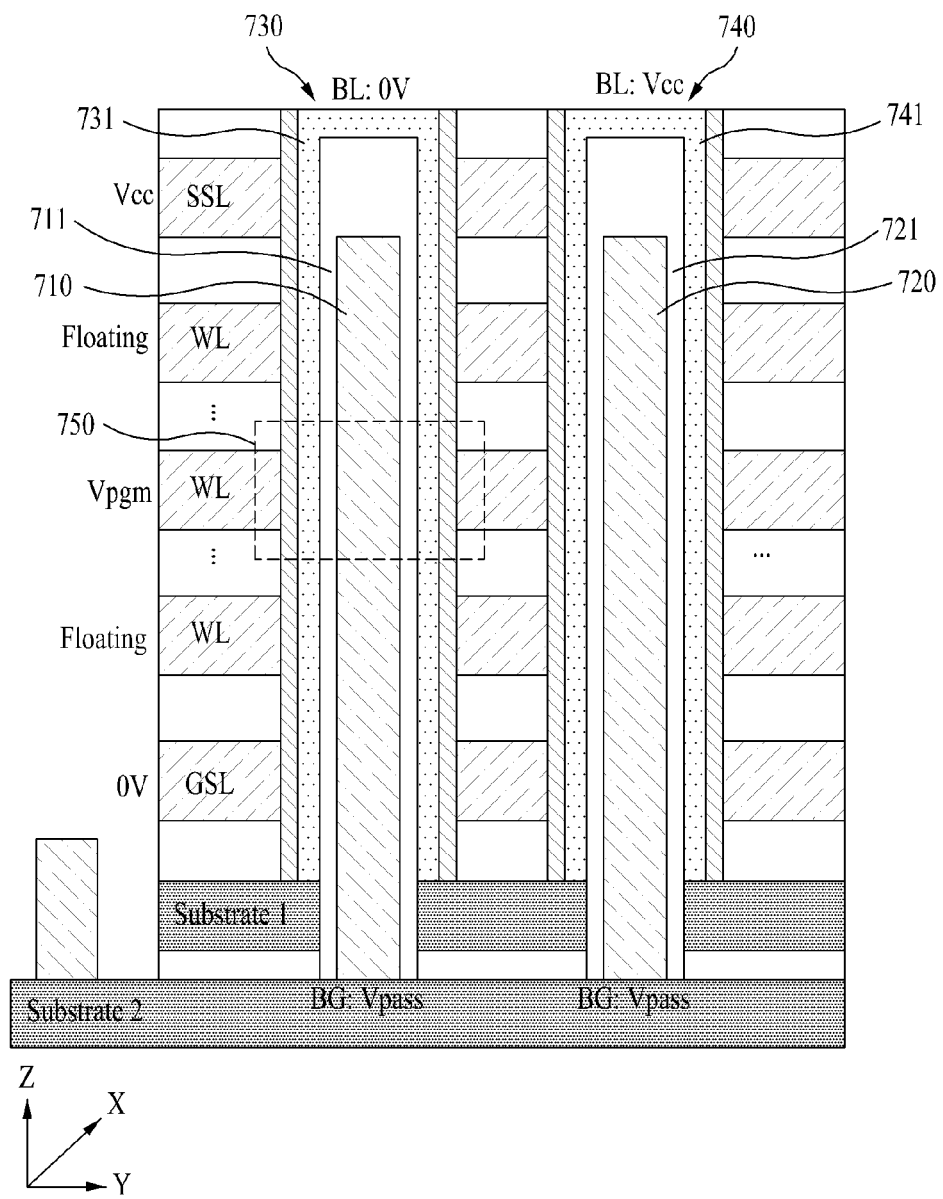
FIG. 7 is a Y-Z cross-sectional view for describing a program operation of a three-dimensional flash memory according to an embodiment.

FIG. 6 is a flowchart illustrating a program operation of a three-dimensional flash memory according to an embodiment, and FIG. 7 is a Y-Z cross-sectional view for describing a program operation of a three-dimensional flash memory according to an embodiment. A program operation to be described below is based on a scheme in which a pass voltage for forming a channel at a channel layer or boosting the channel layer is applied to a back gate.

Referring to FIG. 6, in operation S610, a three-dimensional flash memory may apply the pass voltage for forming a channel at a channel layer 731/741 or boosting the channel layer 731/741 to back gates 710 and 720.

In detail, in operation S610, with regard to a string 730 corresponding to a target memory cell 750 to be programmed from among a plurality of strings, the three-dimensional flash memory may apply a ground voltage of 0 V to a bit line of the selected string 730, may apply a power supply voltage (e.g., 3.3 V) to a string selection line SSL, and may apply the ground voltage of 0 V to a ground selection line GSL, as illustrated in FIG. 7; then, the three-dimensional flash memory may apply a program voltage Vpgm to a word line corresponding to the target memory cell 750 from among a plurality of word lines and may apply a pass voltage (e.g., 6 V) to the back gate 710 while floating word lines corresponding to the remaining memory cells from among the plurality of word lines.

Here, a value of the pass voltage applied to the back gates 710 and 720 may be determined depending on a thickness of insulating layers 711 and 721 surrounding the back gates 710 and 720. For example, in the case where the insulating layers 711 and 721 are 5 nm thick, a value of the pass voltage applied to the back gates 710 and 720 may be determined as 3 V to 4 V; in the case where the insulating layers 711 and 721 are 10 nm thick, a value of the pass voltage applied to the back gates 710 and 720 may be determined as 5 V to 10 V. Alternatively, in the case where the insulating layers 711 and 721 are 15 nm thick, a value of the pass voltage applied to the back gates 710 and 720 may be determined as 7 V to 15 V.

In this case, in operation S610, with regard to an unselected string 740 not corresponding to the target memory cell 750 from among the plurality of strings, the three-dimensional flash memory may apply the power supply voltage (e.g., 3.3 V) to a bit line of the unselected string 740 and may apply the power supply voltage (e.g., 3.3 V) to the string selection line SSL of the unselected string 740. As such, a string selection transistor of the unselected string 740 connected with the string selection line SSL may be shut off, and thus, the unselected string 740 may be floated. Likewise, the ground voltage of 0 V may be applied to the ground selection line GSL of the unselected string 740, the program voltage Vpgm may be applied to the word line corresponding to the target memory cell 750 from among the plurality of word lines, and the word lines corresponding to the remaining memory cells other than the target memory cell 750 from among the plurality of word lines may be floated. Also, because the back gate 710 of the unselected string 740 and the back gate 710 of the selected string 730 are interconnected by a common wire, the same pass voltage (e.g., 6 V) as the back gate 710 of the selected string 730 may be applied to the back gate 720 of the unselected string 740.

Next, in operation S620, the three-dimensional flash memory may form a channel for the program operation associated with the target memory cell 750 at the channel layer 731 included in the selected string 730 by applying the ground voltage to the bit line of the selected string 730, applying the program voltage to the word line corresponding to the target memory cell 750 from among the plurality of word lines, and floating word lines corresponding to the remaining memory cells other than the target memory cell 750 from among the plurality of word lines in a state where the pass voltage is applied to the back gate 710.

Then, in operation S630, as the power supply voltage is applied to a bit line of the unselected string 740 and the power supply voltage is applied to the string selection line SSL of the unselected string 740, the unselected string 740 may be floated; at the same time, as the pass voltage is applied to the back gate 720, the channel layer 741 included in the unselected string 740 may be boosted such that memory cells included in the unselected string 740 are prevented from being programmed by the program voltage for the target memory cell 750.

As the program operation is performed through operation S610 and operation 620, the pass voltage may not be applied to the word lines corresponding to the remaining memory cells other than the target memory cell 750, and thus, a disturb phenomenon occurring at the target memory cell 750 due to the pass voltage applied to the word lines corresponding to the remaining memory cells may be prevented. As such, characteristics of the program operation may be improved, that is, a cell characteristic and reliability may be improved. Accordingly, a speed at which a channel is formed at the channel layer 731 of the selected string 730 may be improved.

Also, as the program operation is performed through operation S610 and operation 630, the pass voltage may not be applied to the word lines corresponding to the remaining memory cells other than the target memory cell 750, and thus, a disturb phenomenon occurring at the target memory cell 750 due to the pass voltage applied to the word lines corresponding to the remaining memory cells may be prevented. This may mean that a speed at which the channel layer 741 of the unselected string 740 is boosted is improved.

In this case, a leakage voltage at the ground selection line GSL of the unselected string 740 may be suppressed by forming the insulating layer 721 of the unselected string 740 to be thicker than the remaining region. Alternatively, a leakage current at the ground selection line GSL of the unselected string 740 may be suppressed by applying a structure where a more amount of boron (B) is implanted into a region of the channel layer 741 of the unselected string 740, which corresponds to the ground selection line GSL, such that a threshold voltage of the corresponding region increases.

Also, because the pass voltage is applied to the remaining word lines other than a word line corresponding to a target memory cell at an unselected string, a difference between a channel boosting level of the remaining word lines and a channel boosting level of the word line corresponding to the target memory cell sharply increases. However, according to the program operation using operation S610 and operation 630, the whole channel layer 741 of the unselected string 740 may be boosted, and thus, a channel potential of the channel layer 741 may be improved in boosting. Accordingly, a field-profile in a channel may have a gradual slope around the word line corresponding to the target memory cell.

The description is given above as the program operation is performed based on a scheme where the pass voltage for forming or boosting a channel at the channel layer 731/741 is applied through the back gates 710 and 720 instead of a word line, but embodiments are not limited thereto. For example, the program operation may be performed by further using the scheme in which a separate voltage is applied to the back gates 710 and 720, in addition to a scheme in which the pass voltage for forming or boosting a channel at the channel layer 731/741 is applied through a word line. This will be described in detail with reference to FIGS. 8 and 9.

Figure 8:
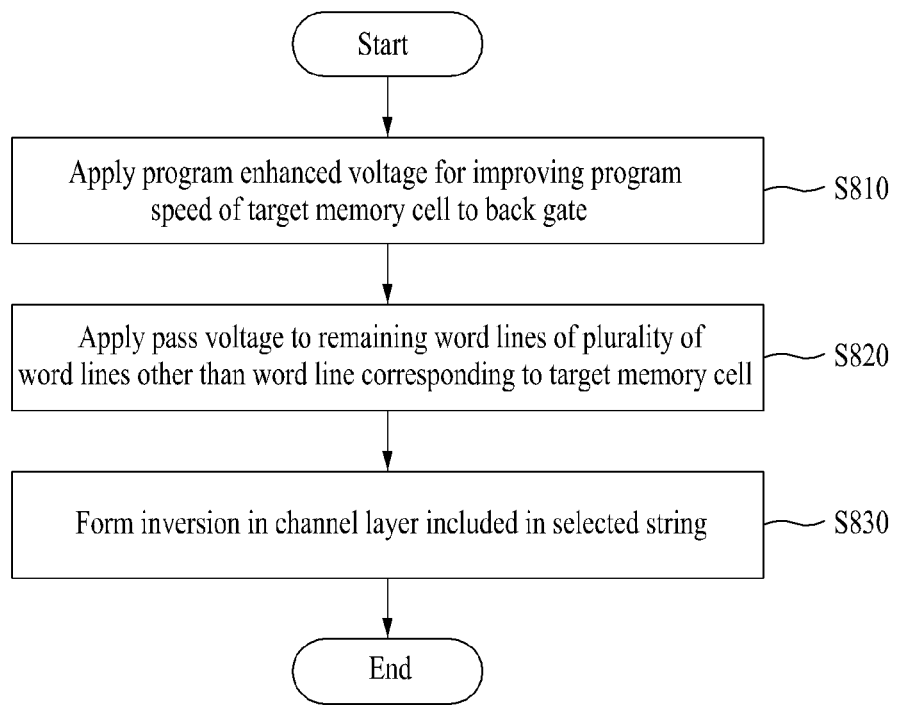
FIG. 8 is a flowchart illustrating a program operation of a three-dimensional flash memory according to another embodiment.
Figure 9:
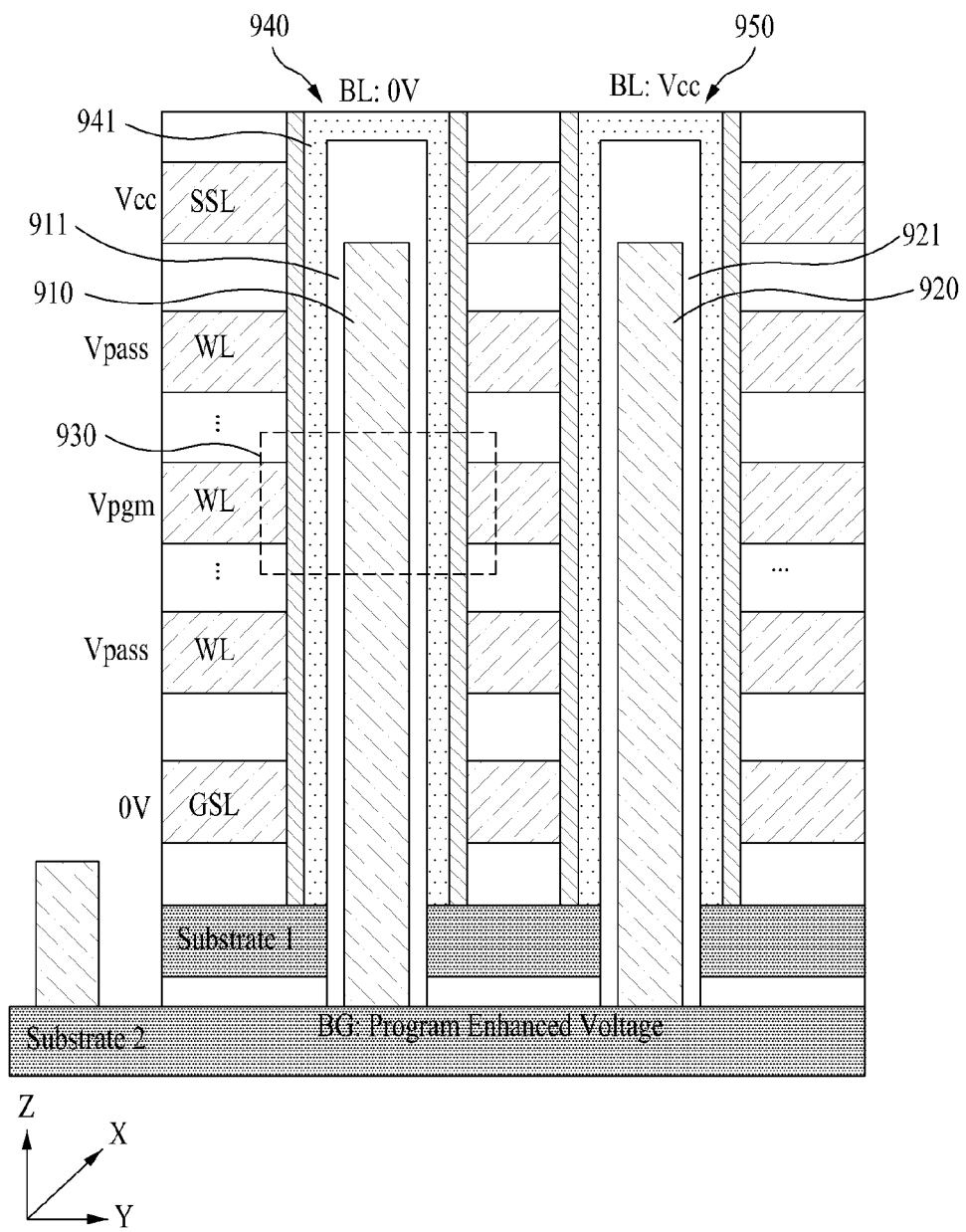
FIG. 9 is a Y-Z cross-sectional view for describing a program operation of a three-dimensional flash memory according to another embodiment.

FIG. 8 is a flowchart illustrating a program operation of a three-dimensional flash memory according to another embodiment, and FIG. 9 is a Y-Z cross-sectional view for describing a program operation of a three-dimensional flash memory according to another embodiment. A program operation to be described below is based on a scheme in which an inversion is formed at a channel layer and a program enhanced voltage for improving a program speed of a target memory cell is applied to a back gate.

Referring to FIG. 8, in operation S810, the three-dimensional flash memory may apply the program enhanced voltage for improving a program speed of a target memory cell 930 to be programmed to back gates 910 and 920.

In detail, in operation S810, the three-dimensional flash memory may apply the program enhanced voltage to the back gate 910 of a selected string 940 corresponding to the target memory cell 930 from among a plurality of strings as illustrated in FIG. 9. Because the back gate 920 of an unselected string 950 and the back gate 910 of the selected string 940 are interconnected by a common wire, the same program enhanced voltage as the back gate 910 of the selected string 940 may be applied to the back gate 920 of the unselected string 950.

Here, a value of the program enhanced voltage applied to the back gates 910 and 920 may be determined depending on a thickness of insulating layers 911 and 921 surrounding the back gates 910 and 920.

Next, in operation S820, the three-dimensional flash memory may apply the pass voltage to the remaining word lines of a plurality of word lines other than a word line corresponding to the target memory cell 930.

In detail, in operation S820, with regard to the selected string 940 corresponding to the target memory cell 930 to be programmed from among the plurality of strings, the three-dimensional flash memory may apply the ground voltage of 0 V to a bit line of the selected string 940, may apply the power supply voltage (e.g., 3.3 V) to the string selection line SSL, and may apply the ground voltage of 0 V to the ground selection line GSL, as illustrated in FIG. 9; then, the three-dimensional flash memory may apply the program voltage Vpgm to the word line corresponding to the target memory cell 930 from among the plurality of word lines and may apply the pass voltage (e.g., 5 V) to the remaining word lines corresponding to the remaining memory cells other than the target memory cell 930 from among the plurality of word lines.

In this case, in operation S820, with regard to the unselected string 950 not corresponding to the target memory cell 930 from among the plurality of strings, the three-dimensional flash memory may apply the power supply voltage (e.g., 3.3 V) to a bit line of the unselected string 950 as illustrated in FIG. 9. Likewise, the power supply voltage (e.g., 3.3 V) may be applied to the string selection line SSL of the unselected string 950, the ground voltage of 0 V may be applied to the ground selection line GSL, the program voltage Vpgm may be applied to the word line corresponding to the target memory cell 930 from among the plurality of word lines, and the pass voltage (e.g., 5 V) may be applied to the word lines corresponding to the remaining memory cells other than the target memory cell 930 from among the plurality of word lines.

Then, in operation S830, as the program enhanced voltage is applied to the back gates 910 and 920, an inversion may be formed at the channel layer 941 included in the selected string 940.

As the program operation is performed through operation S810 and operation S830, the program enhanced voltage may be applied to the back gates 910 and 920 such that an inversion is formed at the channel layer 911. As such, a value of the pass voltage to be applied to word lines corresponding to the remaining memory cells other than the target memory cell 930 may decrease. Accordingly, a disturb phenomenon at the target memory cell 930 may be prevented. As the disturb phenomenon at the target memory cell 930 is prevented, characteristics of the program operation may be improved, that is, a cell characteristic and reliability may be improved. Accordingly, a speed at which a channel is formed at the channel layer 941 of the selected string 940 may be improved.

Figure 10:
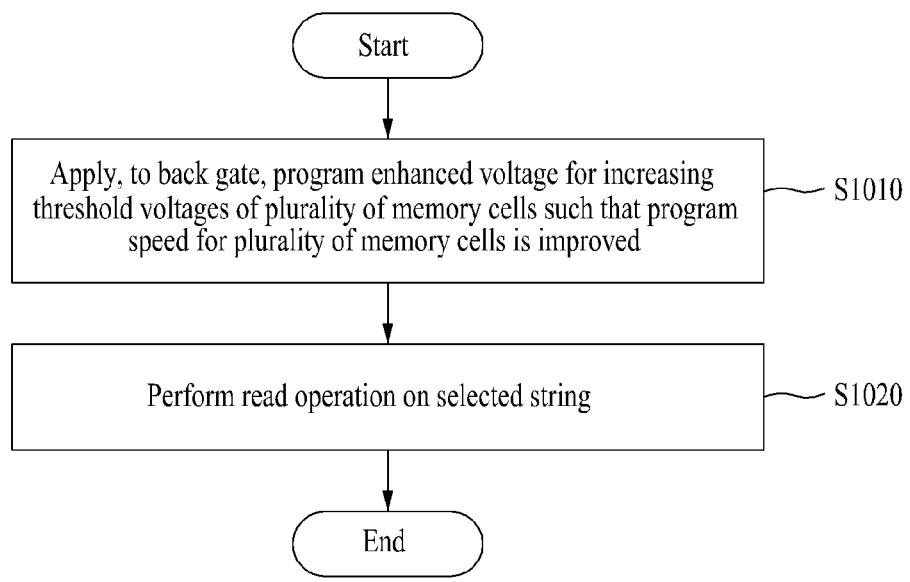
FIG. 10 is a flowchart illustrating a read operation of a three-dimensional flash memory according to an embodiment.

FIG. 10 is a flowchart illustrating a read operation of a three-dimensional flash memory according to an embodiment.

Referring to FIG. 10, in operation S1010, the three-dimensional flash memory may apply a program enhanced voltage to a back gate. Here, the program enhanced voltage that is a voltage for improving a speed of a program operation to be performed following (or immediately after) a read operation may be a negative voltage for increasing threshold voltages of a plurality of memory cells.

That is, operation S1010 may be for the following program operation; after performing operation S1010 in which the program enhanced voltage is applied to the back gate, a general read operation may be performed in operation S1020.

Also, in operation S1010, the three-dimensional flash memory may apply voltages for the general read operation.

In detail, the three-dimensional flash memory may apply the power supply voltage to a bit line of a selected string corresponding to a target memory cell to be read from among a plurality of strings, a verify voltage Vverify to a word line corresponding to the target memory cell from among a plurality of word lines, and may apply the pass voltage to word lines corresponding to the remaining memory cells other than the target memory cell from among the plurality of word lines.

Afterwards, in operation S1020, the three-dimensional flash memory may perform the read operation on the selected string by applying the power supply voltage to the bit line of the selected string, applying the verify voltage Vverify to the word line corresponding to the target memory cell from among the plurality of word lines, and applying the pass voltage to the word lines corresponding to the remaining memory cells other than the target memory cell from among the plurality of word lines.

As operation S1010 for improving a speed of the program operation following the read operation is performed, the threshold voltages of the memory cells may increase, and thus, a speed at which the program operation is performed may be improved.

Also, as the read operation is performed through operation S1010 and operation S1020, while controlling back gates in units of block by which a plurality of strings are grouped, the three-dimensional flash memory may improve channel boosting of an unselected block including unselected strings by using back gates and may improve channel boosting of unselected strings in a selected block including selected strings by using back gates. Accordingly, a disturb phenomenon occurring at the target memory cell of the selected string due to the pass voltage applied to word lines corresponding to the remaining memory cells may be prevented. This may mean that the cell characteristic and reliability are improved.

Also, as the program enhanced voltage is applied to a back gate in operation S1010, a voltage field toward a back gate from a word line may be uniformly distributed, and thus, unintended lateral diffusion of electrons may be prevented. For example, in a three-dimensional flash memory of an existing structure where a back gate does not exist, lateral diffusion of electrons occurs due to a field of a pass voltage applied to the corresponding word line and the pass voltage applied to adjacent word lines, thereby causing the degradation of a cell characteristic. However, the three-dimensional flash memory according to an embodiment may apply the program enhanced voltage to a back gate in operation S1010 such that a voltage field toward a back gate from a word line is uniformly distributed. Accordingly, unintended lateral diffusion of electrons may be prevented. That is, the cell characteristic and reliability may be improved.

Figure 11:
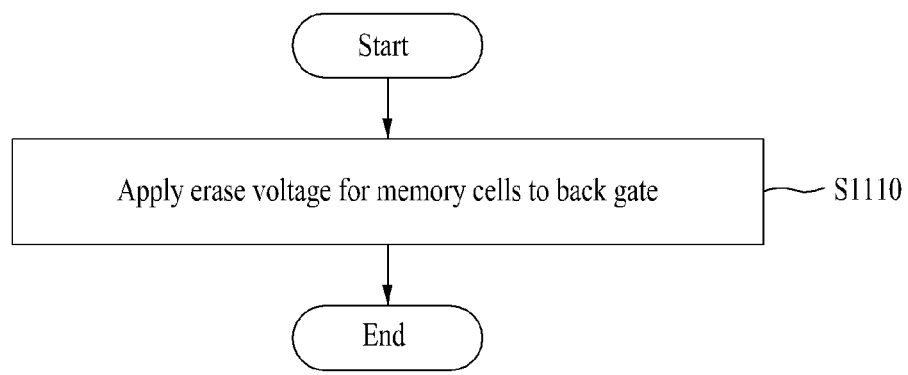
FIG. 11 is a flowchart illustrating an erase operation of a three-dimensional flash memory according to an embodiment.

FIG. 11 is a flowchart illustrating an erase operation of a three-dimensional flash memory according to an embodiment.

Referring to FIG. 11, the three-dimensional flash memory may perform a bulk erase manner based on a back gate by applying an erase voltage for memory cells included in a plurality of strings to the back gate in operation S1110.

The back gate-based erase manner may make a hole movement easy compared to a bulk erase manner, thus improving a speed at which an erase operation is performed.

Figure 12:
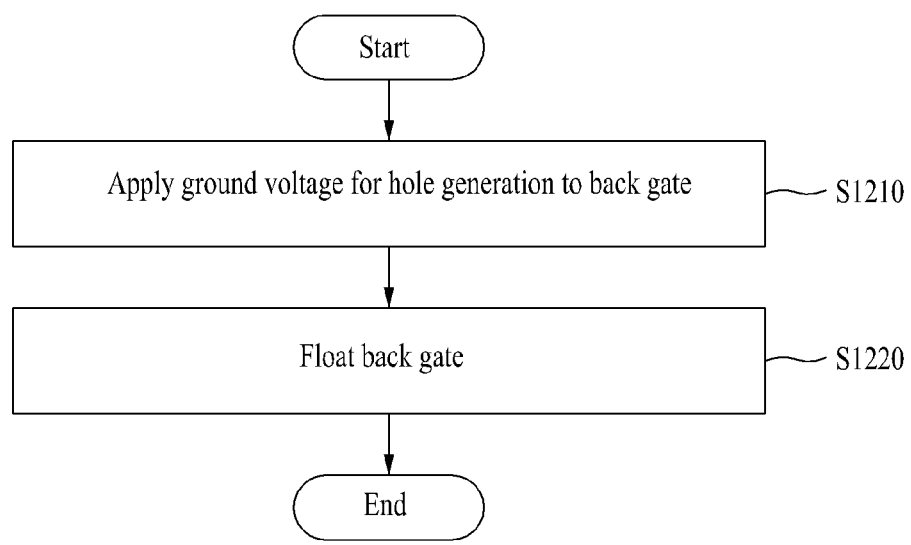
FIG. 12 is a flowchart illustrating an erase operation of a three-dimensional flash memory according to another embodiment.
Figure 13:
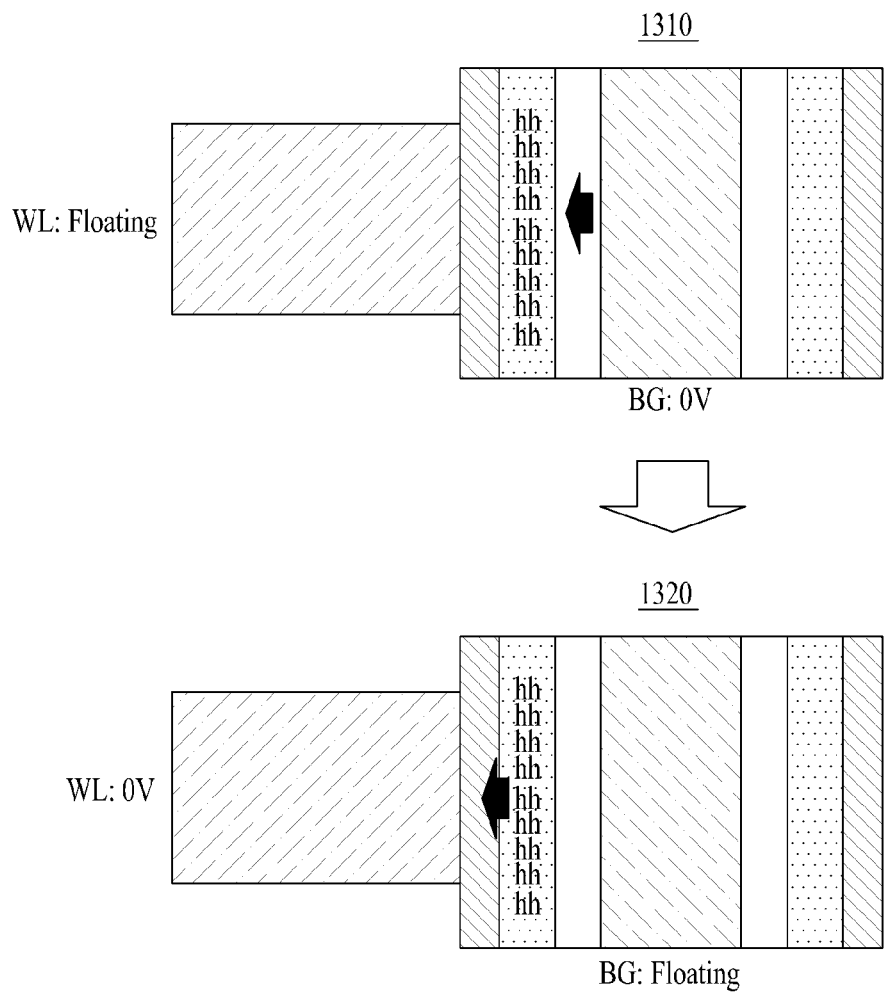
FIG. 13 is a Y-Z cross-sectional view for describing an erase operation of a three-dimensional flash memory according to an embodiment.

FIG. 12 is a flowchart illustrating an erase operation of a three-dimensional flash memory according to another embodiment, and FIG. 13 is a Y-Z cross-sectional view for describing an erase operation of a three-dimensional flash memory according to another embodiment. An erase operation to be described below is characterized in that voltages for performing the erase operation on memory cells in two steps (i.e., a first step and a second step) are applied to a back gate. For convenience of description, a specific memory cell to be erased in a three-dimensional flash memory is enlarged and illustrated in FIG. 13.

Referring to FIG. 12, in operation S1210, the three-dimensional flash memory may apply the ground voltage (e.g., 0 V) to the back gate such that holes are generated as a plurality of word lines are floated and an erase voltage (e.g., 10 V) is applied to a channel bulk, in the first step of the erase operation (refer to 1310 of FIG. 13). As the holes are generated, a channel may be formed at a channel layer.

Afterwards, in operation S1220, the three-dimensional flash memory may float the back gate such that holes are injected as the ground voltage is applied to the plurality of word lines and the erase voltage (e.g., 10 V) is applied to the channel bulk, in the second step of the erase operation (refer to 1320 of FIG. 13). As such, holes may be injected into a charge storage layer.

Below, it is assumed that a method for manufacturing a three-dimensional flash memory is performed by an automated and mechanized manufacturing system. The method may mean the method for manufacturing the three-dimensional flash memory described with reference to FIGS. 3A and 3B, but embodiments are not limited thereto. For example, it is capable of being applied to the method for manufacturing the three-dimensional flash memory of the structure described with reference to FIGS. 4A to 4D, 5A, and 5B.

Also, for convenience of description, one of a plurality of strings is illustrated in drawings for describing a method for manufacturing a three-dimensional flash memory, which will be described below.

Figure 14:
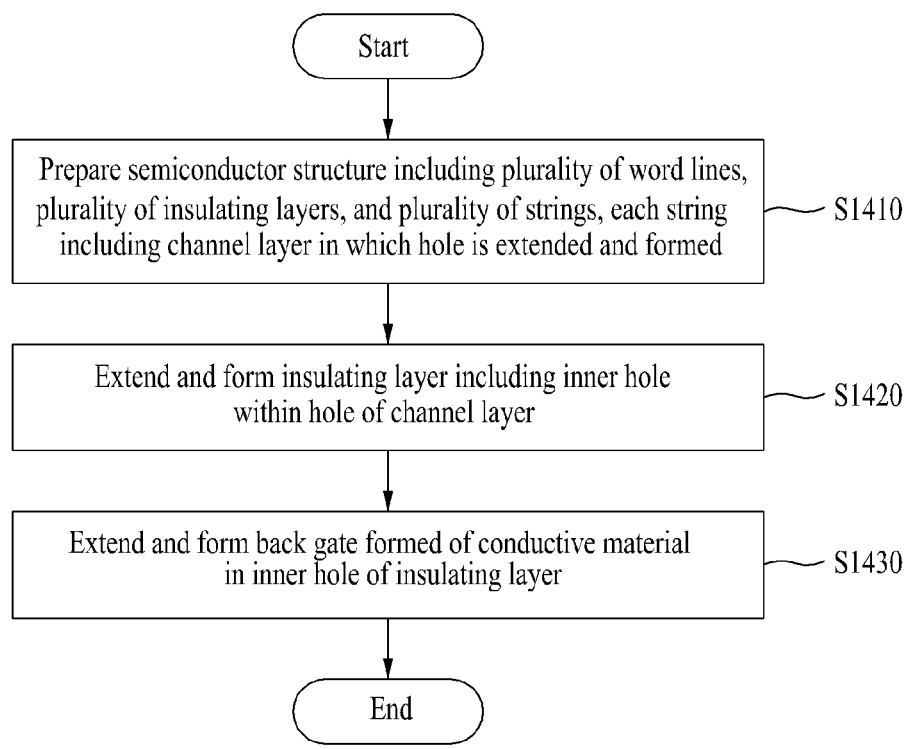
FIG. 14 is a flowchart illustrating a three-dimensional flash memory manufacturing method according to an embodiment.

FIG. 14 is a flowchart illustrating a three-dimensional flash memory manufacturing method according to an embodiment. FIGS. 15A to 15D are Y-Z cross-sectional views for describing a first implementation example of the three-dimensional flash memory manufacturing method illustrated in FIG. 14. FIGS. 16A and 16B are Y-Z cross-sectional views for describing a second implementation example of the three-dimensional flash memory manufacturing method illustrated in FIG. 14.

Referring to FIG. 14, in operation S1410, a manufacturing system may prepare a semiconductor structure.

Figure 15A:
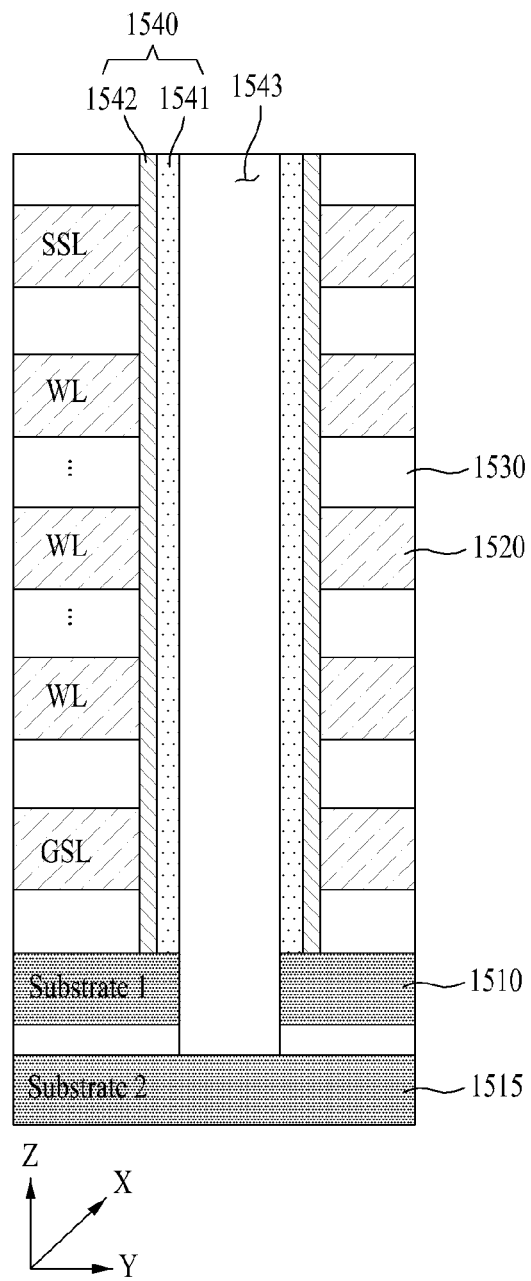
FIGS. 15A to 15D are Y-Z cross-sectional views for describing a first implementation example of a three-dimensional flash memory manufacturing method illustrated in FIG. 14.
Figure 16A:
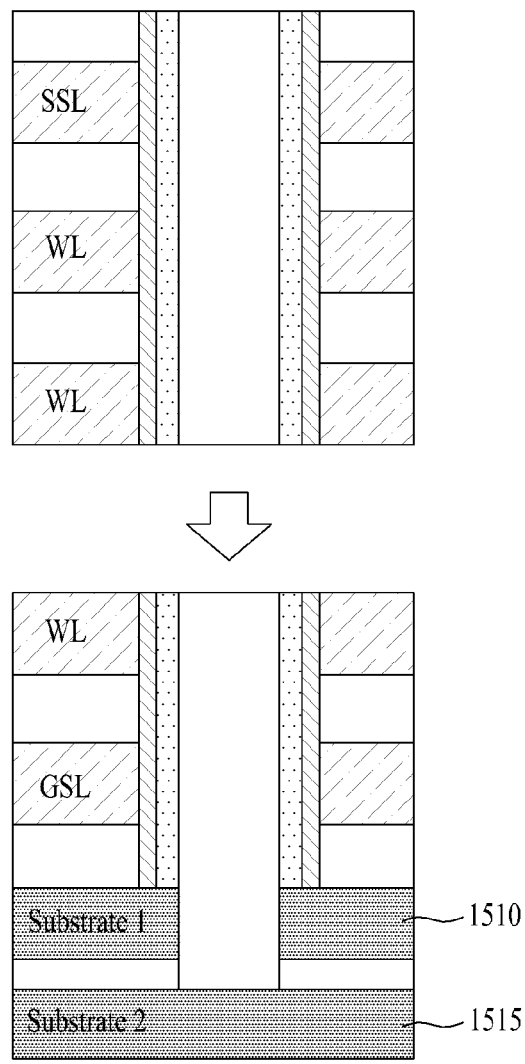
FIGS. 16A and 16B are Y-Z cross-sectional views for describing a second implementation example of a three-dimensional flash memory manufacturing method illustrated in FIG. 14.
Figure 16B:
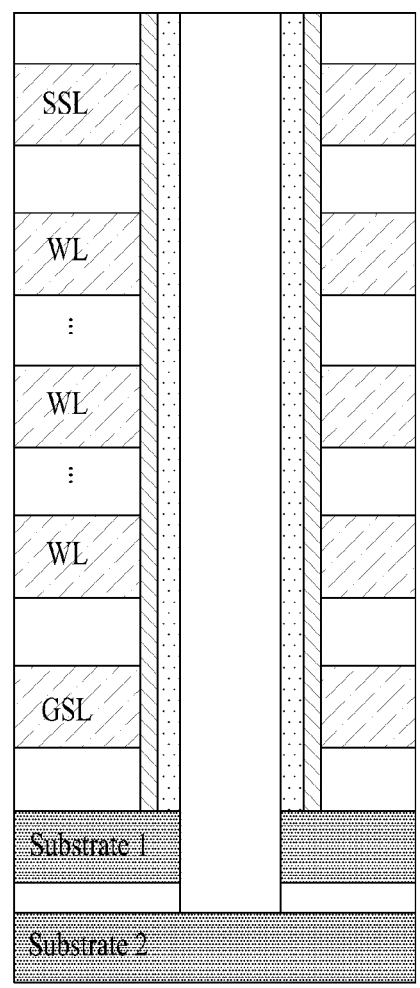

For example, as illustrated in FIG. 15A, the manufacturing system may prepare a semiconductor structure including a plurality of word lines 1520 extended and formed in a horizontal direction on a substrate 1510 so as to be sequentially stacked, a plurality of insulating layers 1530 alternately stacked between the plurality of word lines 1520, and a plurality of strings 1540 penetrating the plurality of insulating layers 1530 and the plurality of word lines 1520 and extended and formed in one direction (e.g., the Z-axis direction) on the substrate 1510.

In the semiconductor structure, each of the plurality of strings 1540 may include a channel layer 1541 extended and formed in one direction (e.g., the Z-axis direction) and a charge storage layer 1542 extended and formed on one direction (e.g., the Z-axis direction) to surround the channel layer 1541, and a hole 1543 may be extended and formed in one direction (e.g., the Z-axis direction) in the channel layer 1541.

Also, the semiconductor structure may further include a substrate 1515 for a back gate 1560, which is located under the substrate 1510 where the plurality of strings 1540 are extended and formed. Next, the hole 1543 of the channel layer 1541 may penetrate the substrate 1510 where the plurality of strings 1540 are extended and formed and may be extended and formed to the substrate 1515 for the back gate 1560.

Figure 15B:
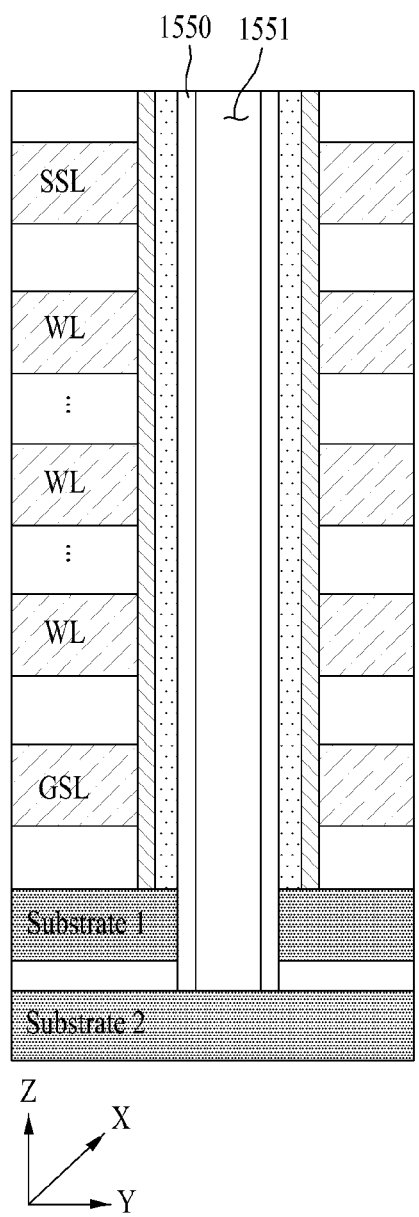

Then, in operation S1420, the manufacturing system may extend and form an insulating layer 1550 including an inner hole 1551 within the hole 1543 in one direction, as illustrated in FIG. 15B.

In operation S1430, the manufacturing system may extend and form the back gate 1560 in one direction within the inner hole 1551 of the insulating layer 1550, and the back gate 1560 may be formed of a conductive material or doped poly silicon. Here, the back gate 1560 may correspond to a component for applying a pass voltage that is used to form a channel at the channel layer 1541 or boosts the channel layer 1541.

Figure 15C:
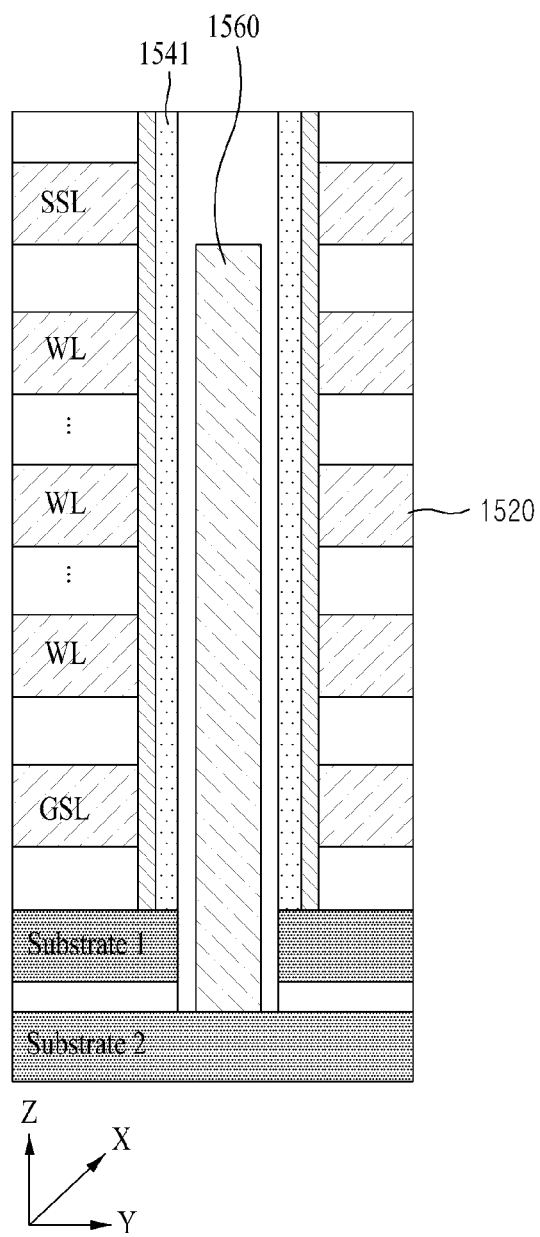
Figure 15D:
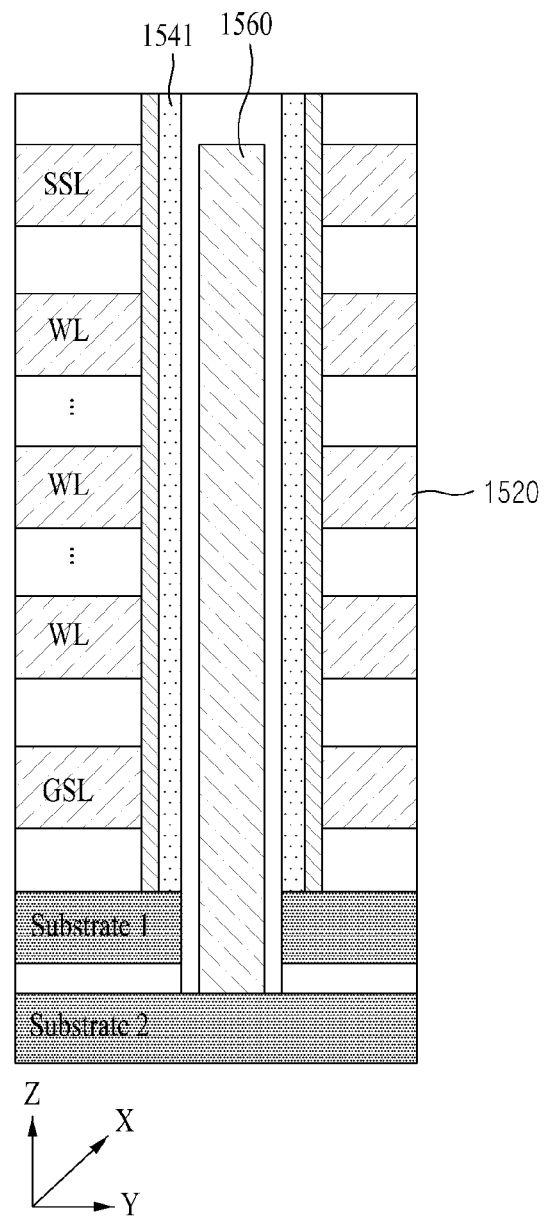

In operation S1430, as illustrated in FIG. 15C, the back gate 1560 may be extended and formed to a region of the plurality of word lines 1520 under the string selection line SSL within the channel layer 1541, with at least a portion of the back gate 1560 surrounded by the channel layer 1541. However, embodiments are not limited thereto. For example, as illustrated in FIG. 15D, the back gate 1560 may be extended and formed to a region of the string selection line SSL within the channel layer 1541.

Although not illustrated separately in FIG. 14, the manufacturing system may form a drain region over the plurality of strings 1540 after operation S1430.

The three-dimensional flash memory manufacturing method according to an embodiment may be based on a way to use a semiconductor structure where the hole 1543 is extended and formed at the channel layer 1541, and the used semiconductor structure may be manufactured in advance as illustrated in FIGS. 16A and 16B. For example, the manufacturing system may prepare the semiconductor structure in operation S1410 described above, by sequentially stacking a lower semiconductor structure and an upper semiconductor structure as illustrated in FIG. 16B, and the lower semiconductor structure and the upper semiconductor structure may be prepared as illustrated in FIG. 16A.

The description is given above as a channel layer including a hole therein is used in operation S1420 and an insulating layer including a hole therein is used in operation S1430. However, the three-dimensional flash memory manufacturing method may perform a process of forming a hole of a channel layer and a process of forming a hole of an insulating layer through additional separate processes, by preparing a channel layer not including a hole therein in operation S1410 and forming an insulating layer not including a hole therein in operation S1420. In this case, the three-dimensional flash memory manufacturing method may include a first step of preparing a semiconductor structure including a plurality of word lines extended and formed in a horizontal direction on a substrate so as to be sequentially stacked, a plurality of insulating layers stacked alternately between the plurality of word lines, and a plurality of strings penetrating the plurality of insulating layers and the plurality of word lines and extended and formed in one direction (e.g., the Z-axis direction) on the substrate (each of the plurality of strings including a channel layer extended and formed in one direction and a charge storage layer extended and formed in one direction (e.g., the Z-axis direction) to surround the channel layer and a hole being not formed in the channel layer); a second step of extending and forming a first hole at the channel layer in one direction; a third step of extending and forming an insulating layer within the first hole in one direction; a fourth step of extending and forming a second hole at the insulating layer in one direction; a fifth step of extending and forming a back gate formed of a conductive material within the second hole in one direction.

Figure 17:
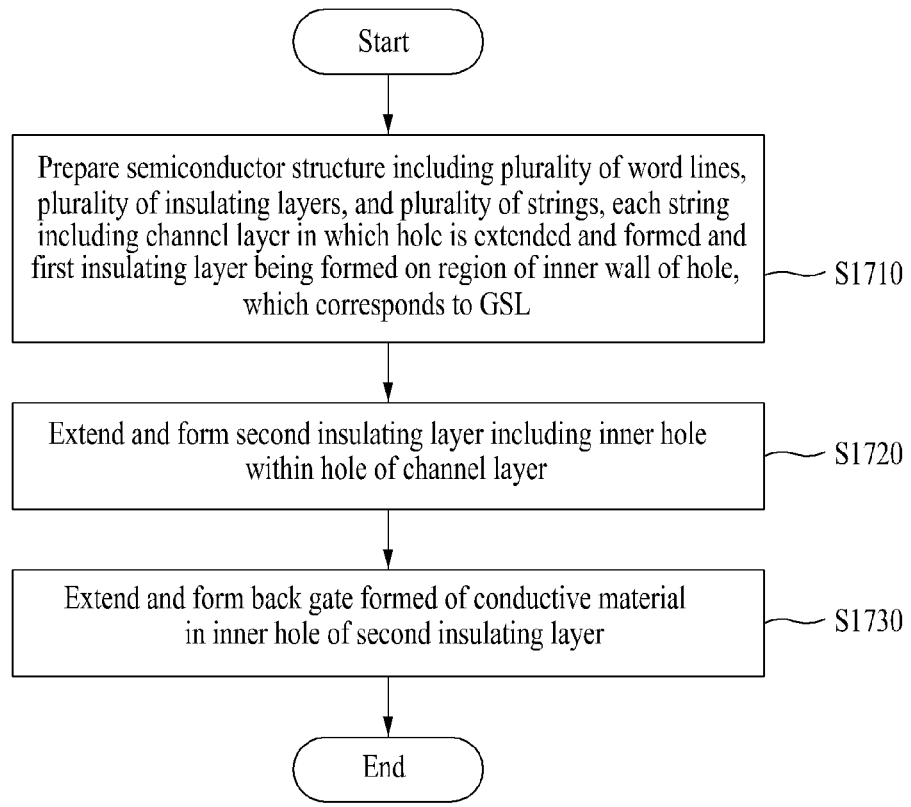
FIG. 17 is a flowchart illustrating a three-dimensional flash memory manufacturing method according to another embodiment.

FIG. 17 is a flowchart illustrating a three-dimensional flash memory manufacturing method according to an embodiment, and FIGS. 18A to 18K are Y-Z cross-sectional views for describing an implementation example of the three-dimensional flash memory manufacturing method illustrated in FIG. 17.

Referring to FIG. 17, in operation S1710, a manufacturing system may prepare a semiconductor structure.

Figure 18A:
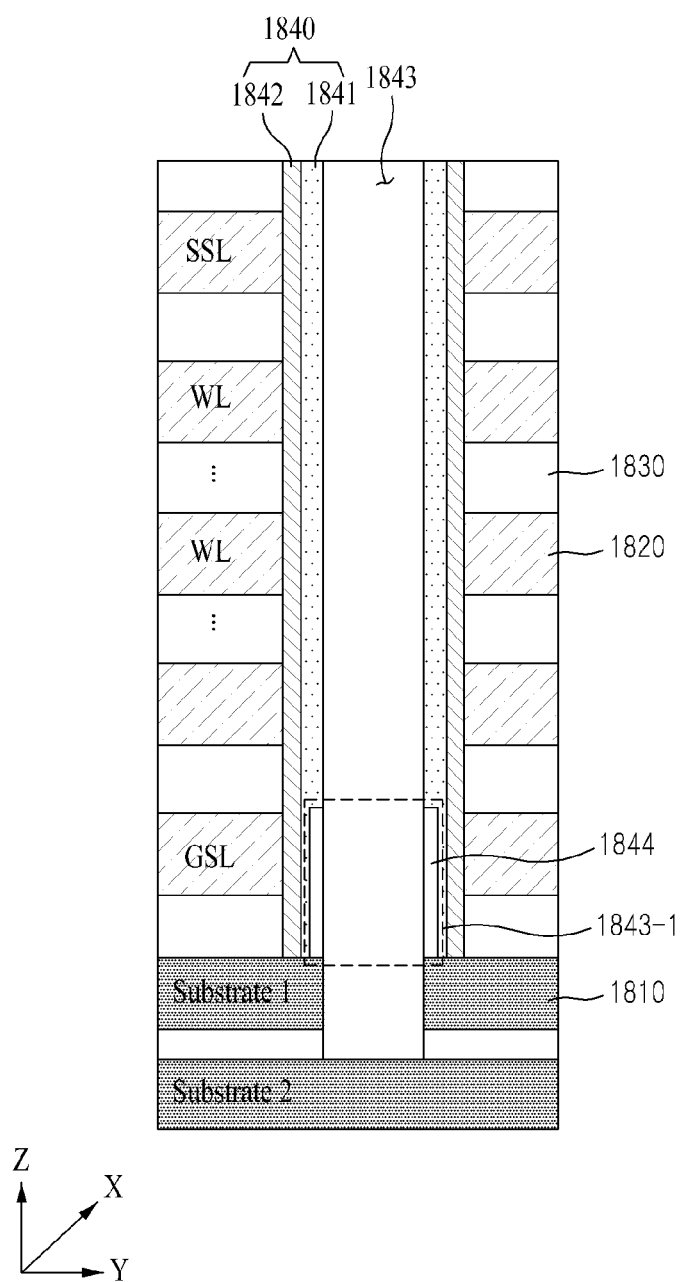

For example, as illustrated in FIG. 18A, the manufacturing system may prepare a semiconductor structure including a plurality of word lines 1820 extended and formed in a horizontal direction on a substrate 1810 so as to be sequentially stacked, a plurality of insulating layers 1830 alternately stacked between the plurality of word lines 1820, and a plurality of strings 1840 penetrating the plurality of insulating layers 1830 and the plurality of word lines 1820 and extended and formed in one direction (e.g., the Z-axis direction) on the substrate 1810.

In the semiconductor structure, each of the plurality of strings 1840 may include a channel layer 1841 extended and formed in one direction (e.g., the Z-axis direction) and a charge storage layer 1842 extended and formed on one direction (e.g., the Z-axis direction) to surround the channel layer 1841, and a hole 1843 may be extended and formed in one direction (e.g., the Z-axis direction) in the channel layer 1841.

Figure 18B:
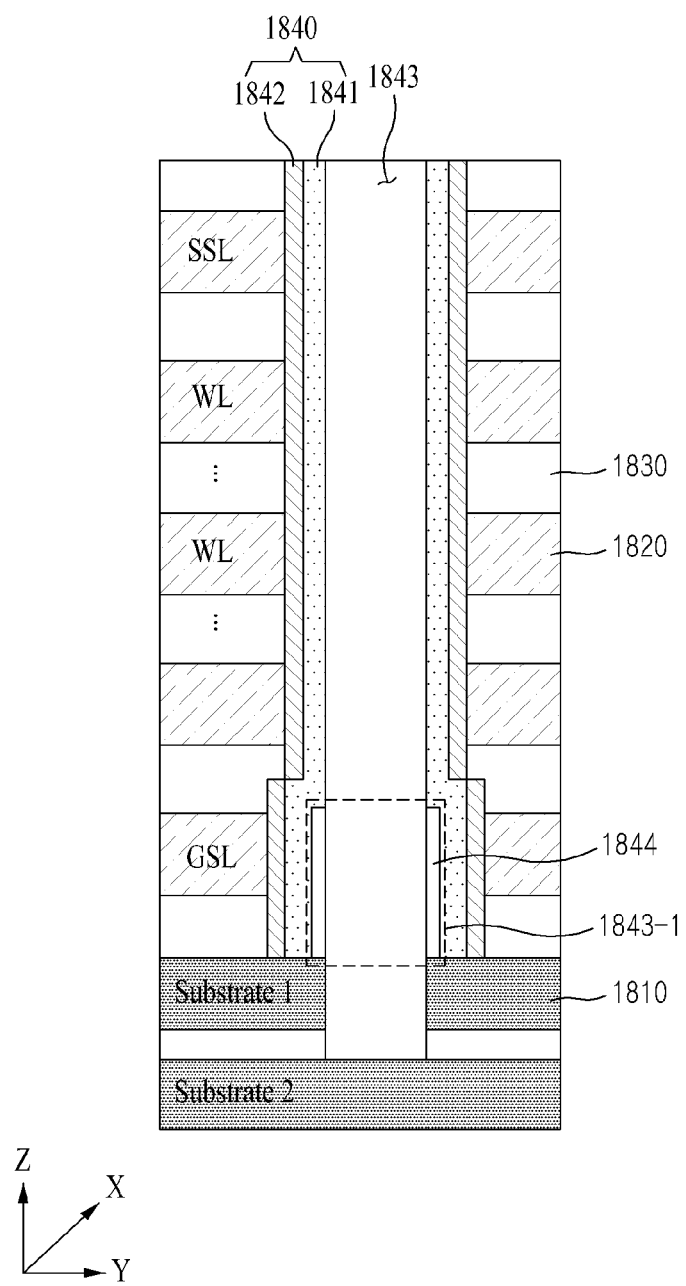
Figure 18D:
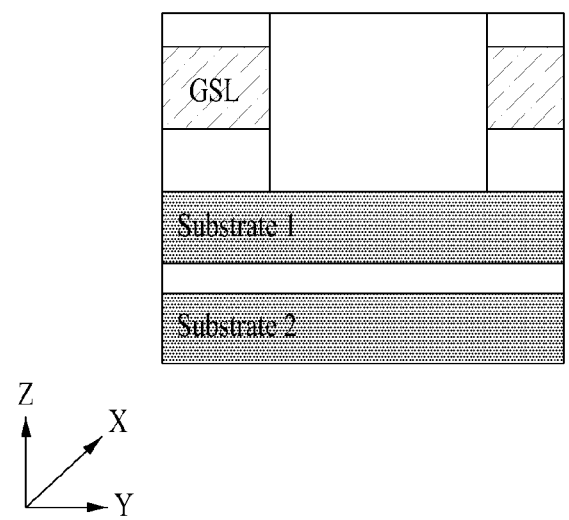
Figure 18F:
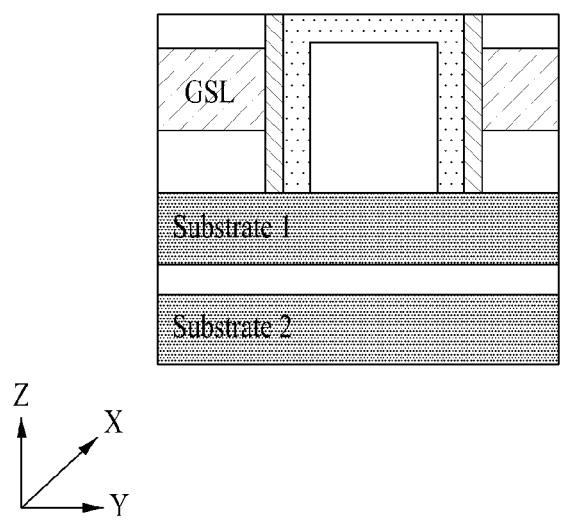
Figure 18G:
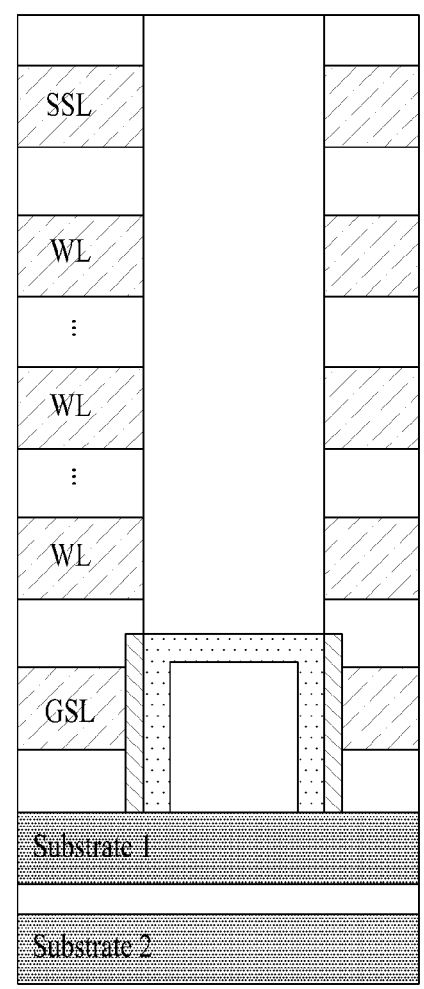
Figure 18H:
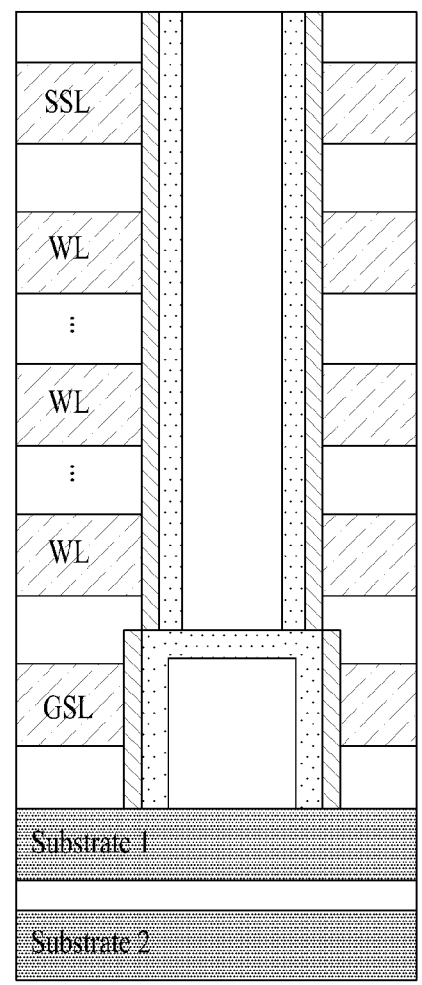
Figure 18I:
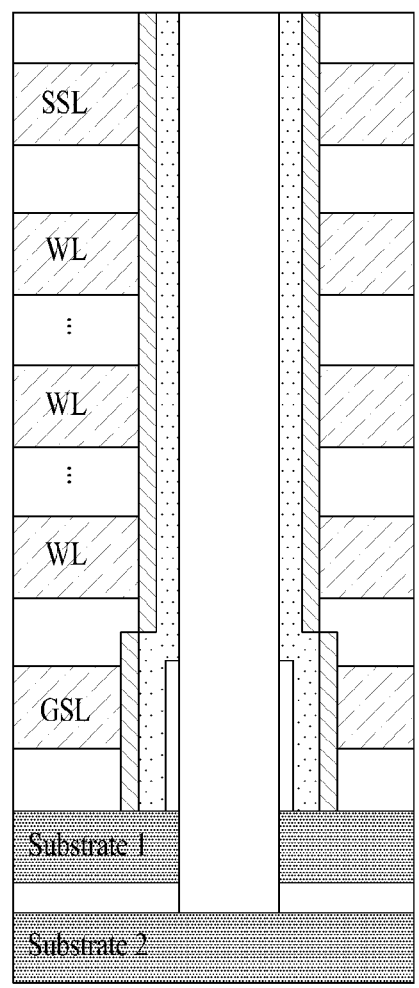

In particular, a first insulating layer 1844 may be formed in a region 1843-1 of an inner wall of the hole 1843, which corresponds to the ground selection line GSL, and a region of the channel layer 1841, which corresponds to the ground selection line GSL, may have a cross section larger than the remaining region of the channel layer 1841 as illustrated in FIG. 18B. Below, the three-dimensional flash memory manufacturing method will be described as there is manufactured a three-dimensional flash memory having a structure where a region of the channel layer 1841, which corresponds to the ground selection line GSL, has a cross section larger than the remaining region of the channel layer 1841.

The semiconductor structure described above may be prepared through processes illustrated in FIGS. 18C to 18I.

Also, the semiconductor structure may further include a substrate 1815 for a back gate 1860, which is located under the substrate 1810 where the plurality of strings 1840 are extended and formed. Next, the hole 1843 of the channel layer 1841 may penetrate the substrate 1810 where the plurality of strings 1840 are extended and formed and may be extended and formed to the substrate 1815 for the back gate 1860.

Figure 18J:
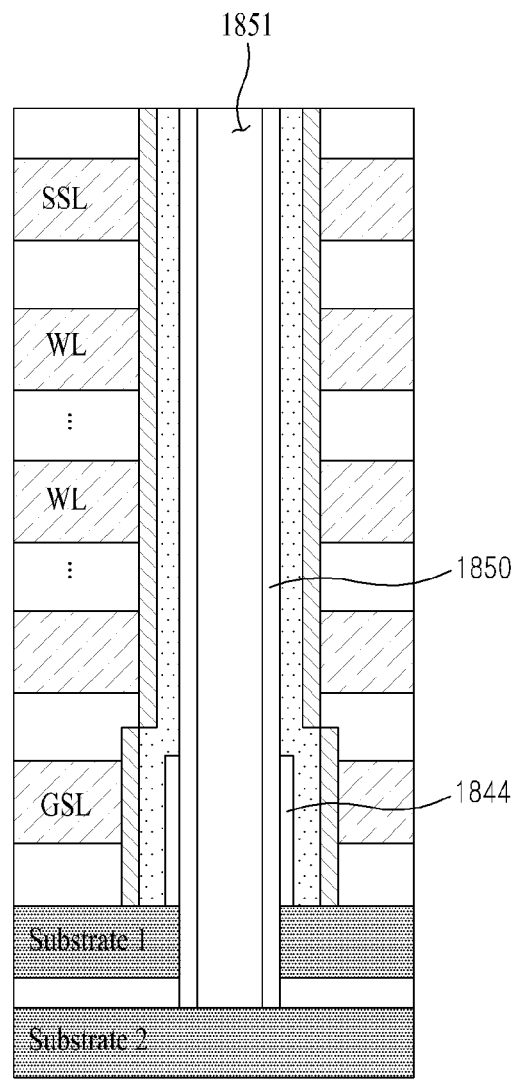
Figure 18K:
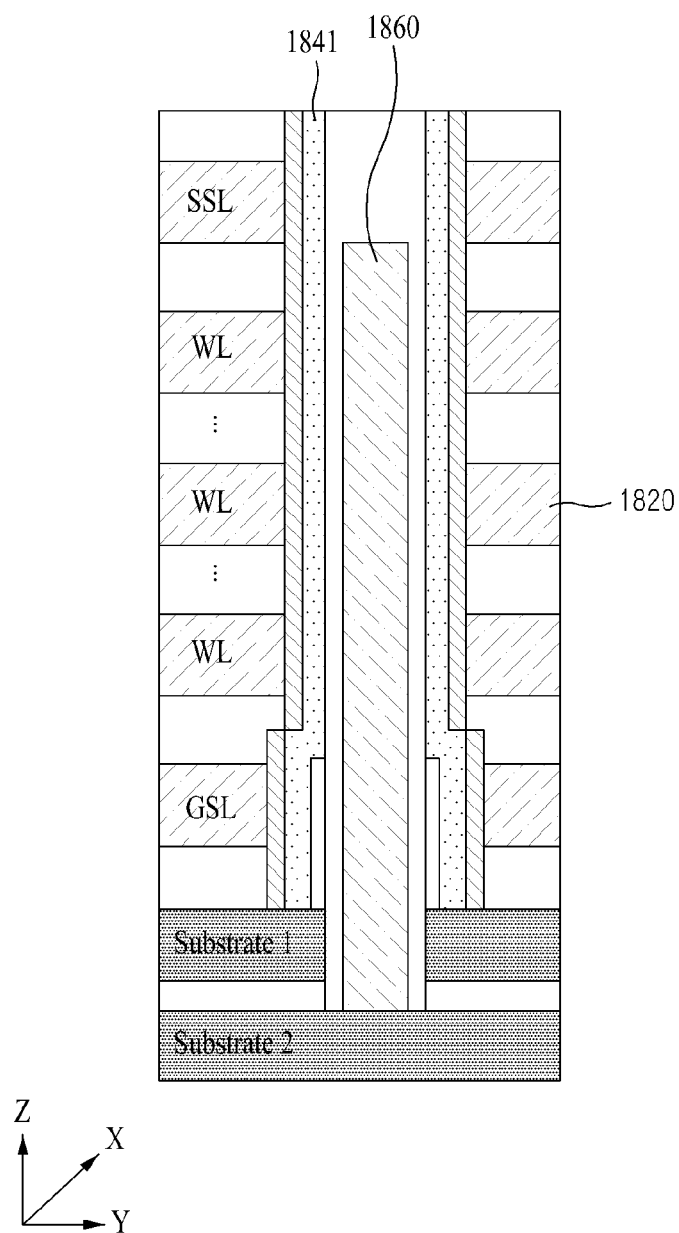

Then, in operation S1720, the manufacturing system may extend and form a second insulating layer 1850 including an inner hole 1851 within the hole 1843 in one direction, as illustrated in FIG. 18J.

In operation S1730, the manufacturing system may extend and form the back gate 1860 in one direction within the inner hole 1851 of the second insulating layer 1850, and the back gate 1860 may be formed of a conductive material or doped poly silicon. Here, the back gate 1860 may correspond to a component for applying a pass voltage that is used to form a channel at the channel layer 1841 or boosts the channel layer 1841.

The description is given in operation S1730 as the back gate 1860 is extended and formed to a region of the plurality of word lines 1820 under the string selection line SSL within the channel layer 1841, with at least a portion of the back gate 1860 surrounded by the channel layer 1841. However, embodiments are not limited thereto. For example, as described above, the back gate 1860 may be extended and formed to a region of the string selection line SSL within the channel layer 1841.

Also, in operation S1730, a drain region may be formed over the plurality of strings 1840.

The three-dimensional flash memory manufacturing method according to another embodiment may be based on a way to implement a structure where a region of an insulating layer, which corresponds to the ground selection line GSL, is thicker than the remaining region of the insulating layer, and a semiconductor structure used in the way (in more detail, the semiconductor structure in operation S1710) may be prepared through processes illustrated in FIGS. 18C to 18J.

FIG. 19 is a flowchart illustrating a three-dimensional flash memory manufacturing method according to another embodiment, and FIGS. 20A to 20E are Y-Z cross-sectional views for describing an implementation example of the three-dimensional flash memory manufacturing method illustrated in FIG. 19.

Referring to FIG. 19, in operation S1910, a manufacturing system may prepare a semiconductor structure.

Figure 20A:
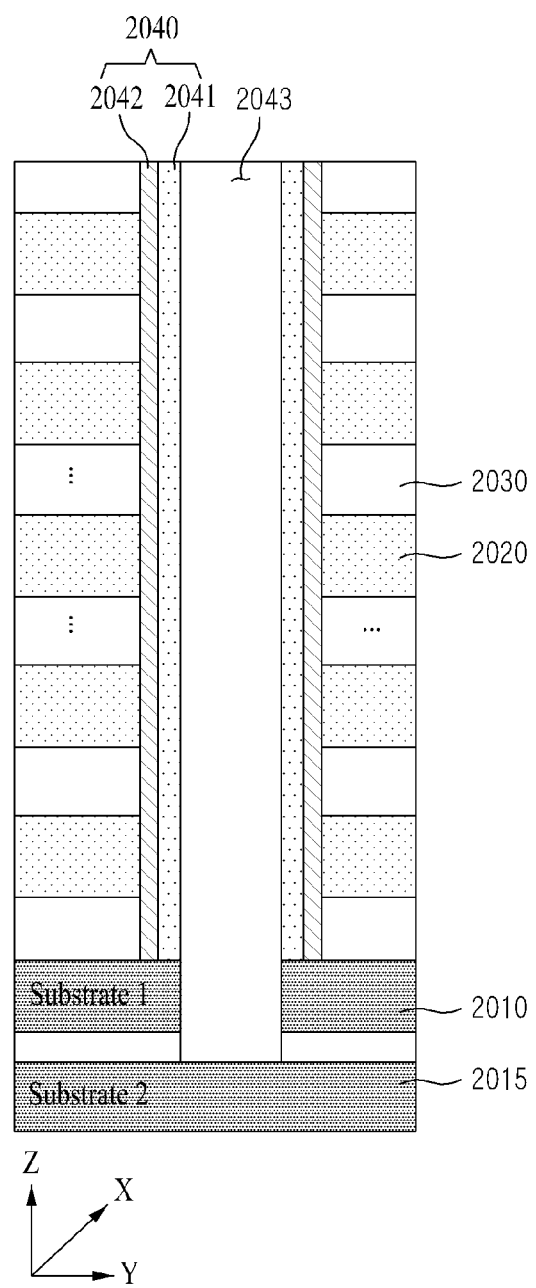
FIGS. 20A to 20E are Y-Z cross-sectional views for describing an implementation example of a three-dimensional flash memory manufacturing method illustrated in FIG. 19.

For example, as illustrated in FIG. 20A, the manufacturing system may prepare a semiconductor structure including a plurality of sacrificial layers 2020 extended and formed in a horizontal direction on a substrate 2010 so as to be sequentially stacked, a plurality of insulating layers 2030 alternately stacked between the plurality of sacrificial layers 2020, and a plurality of strings 2040 penetrating the plurality of insulating layers 2030 and the plurality of sacrificial layers 2020 and extended and formed in one direction (e.g., the Z-axis direction) on the substrate 2010.

In the semiconductor structure, each of the plurality of strings 2040 may include a channel layer 2041 extended and formed in one direction (e.g., the Z-axis direction) and a charge storage layer 2042 extended and formed on one direction (e.g., the Z-axis direction) to surround the channel layer 2041, and a hole 2043 may be extended and formed in one direction (e.g., the Z-axis direction) in the channel layer 2041.

Also, the semiconductor structure may further include a substrate 2015 for a back gate 2060, which is located under the substrate 2010 where the plurality of strings 2040 are extended and formed. Next, the hole 2043 of the channel layer 2041 may penetrate the substrate 2010 where the plurality of strings 2040 are extended and formed and may be extended and formed to the substrate 2015 for the back gate 2060.

Figure 20B:
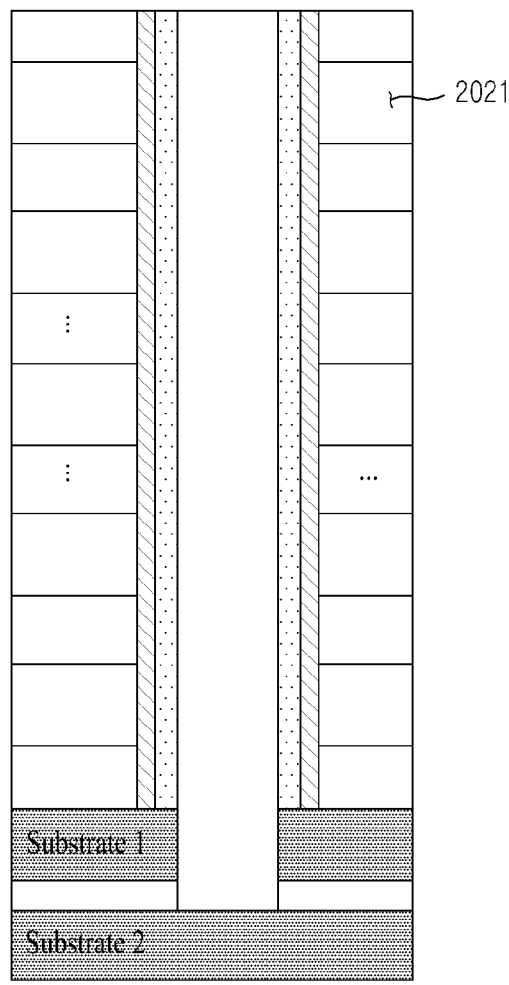

In operation S1920, the manufacturing system may remove the plurality of sacrificial layers 2020 through the hole 2043 of the channel layer 2041, as illustrated in FIG. 20B.

Figure 20C:
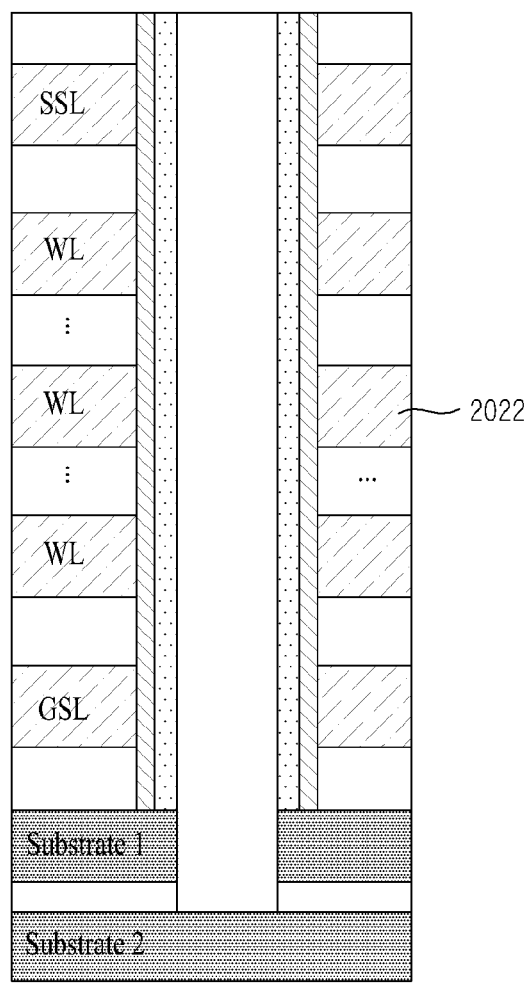

In operation S1930, the manufacturing system may form a plurality of word lines 2022 formed of a conductive material in spaces 2021 where the plurality of sacrificial layers 2020 are removed, as illustrated in FIG. 20C.

Figure 20D:
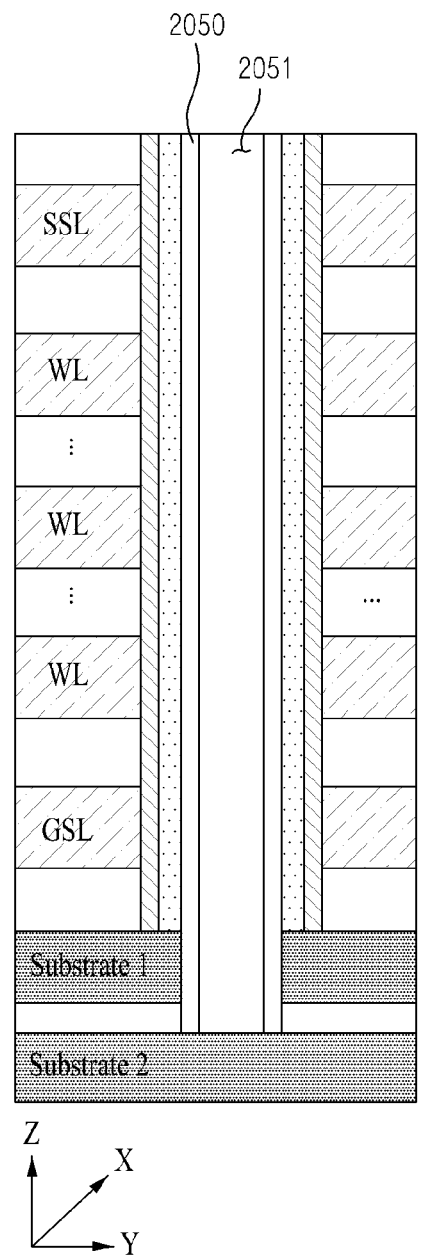

In operation S1940, the manufacturing system may extend and form an insulating layer 2050 including an inner hole 2051 within the hole 2043 in one direction, as illustrated in FIG. 20D.

Figure 20E:
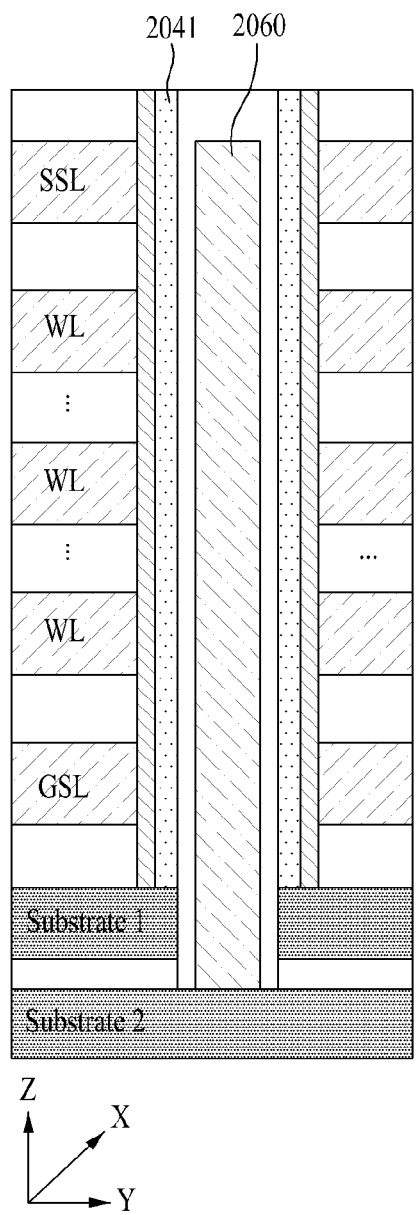

In operation S1950, as illustrated in FIG. 20E, the manufacturing system may extend and form the back gate 2060 in one direction within the inner hole 2051 of the insulating layer 2050, and the back gate 2060 may be formed of a conductive material or doped poly silicon.

Here, the back gate 2060 may correspond to a component for applying a pass voltage that is used to form a channel at the channel layer 2041 or boosts the channel layer 2041.

The description is given in operation S1950 as the back gate 2060 is extended and formed to a region of the plurality of word lines 2022 under the string selection line SSL within the channel layer 2041, with at least a portion of the back gate 1860 surrounded by the channel layer 2041. However, embodiments are not limited thereto. For example, as described above, the back gate 2060 may be extended and formed to a region of the string selection line SSL within the channel layer 2041.

Also, in operation S1950, a drain region may be formed over the plurality of strings 2040.

As described with reference to operation S1920 and operation S1930, the three-dimensional flash memory manufacturing method according to another embodiment may utilize a space (i.e., the hole 2043 of the channel layer 2041), in which the back gate 2060 and the insulating layer 2050 are to be formed, in the process of forming the plurality of word lines 2022, and the remaining processes may be the same as those of the three-dimensional flash memory manufacturing method described with reference to FIG. 14.

Figure 21:
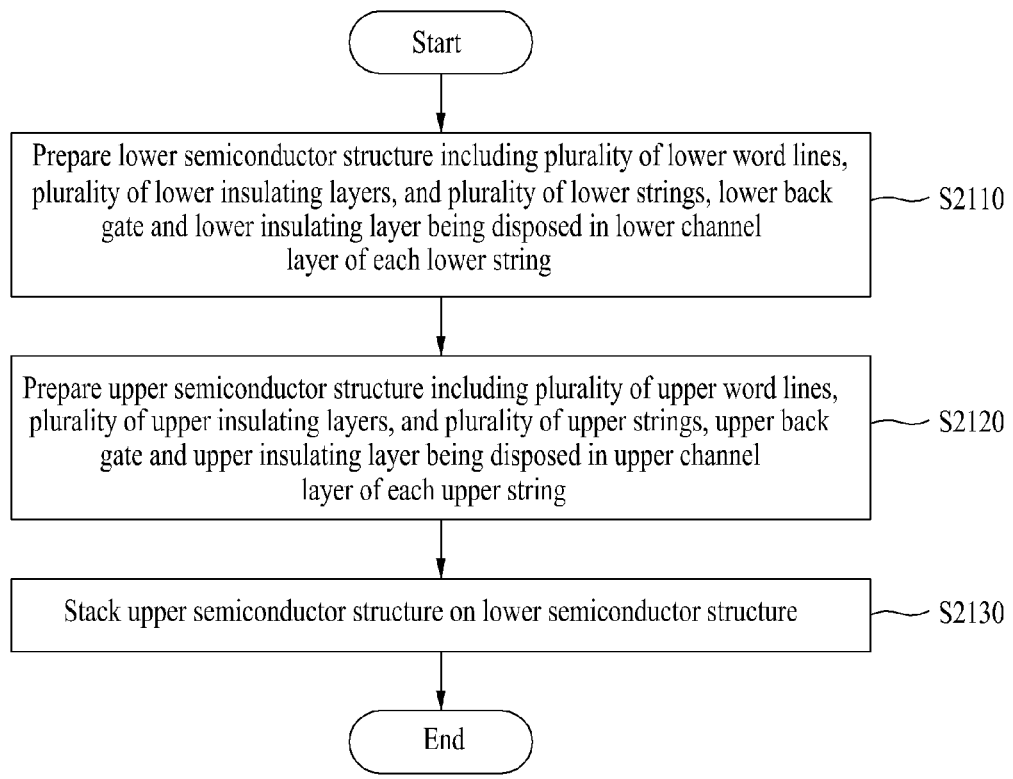
FIG. 21 is a flowchart illustrating a three-dimensional flash memory manufacturing method according to another embodiment.
Figure 22A:
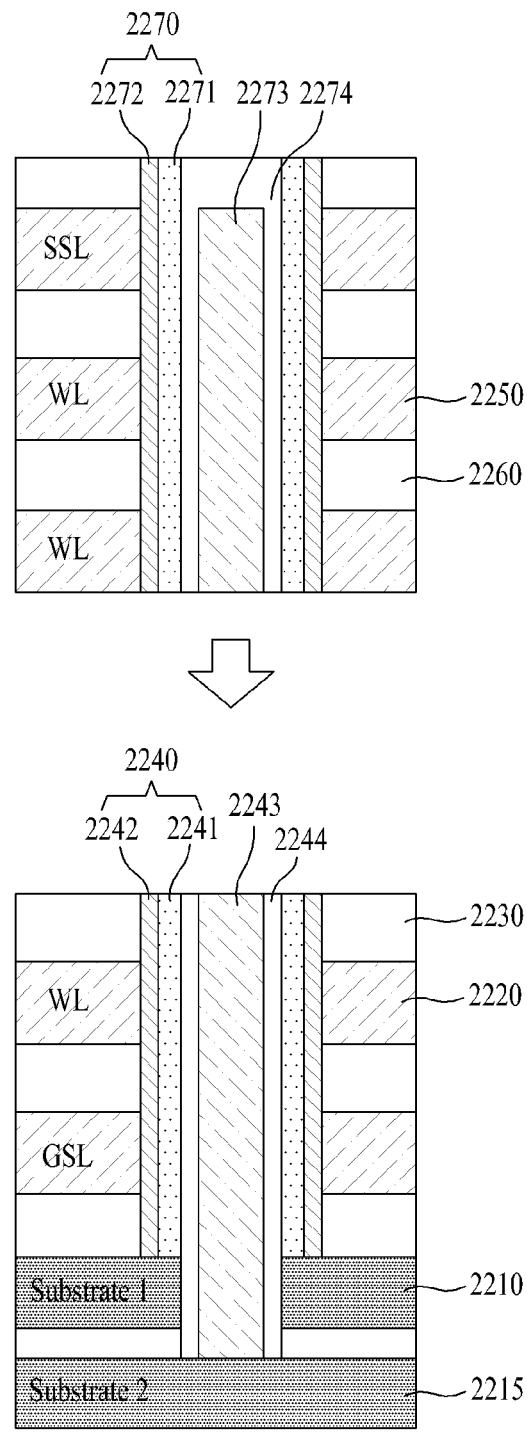
FIGS. 22A and 22B are Y-Z cross-sectional views for describing an implementation example of a three-dimensional flash memory manufacturing method illustrated in FIG. 21.
Figure 22B:
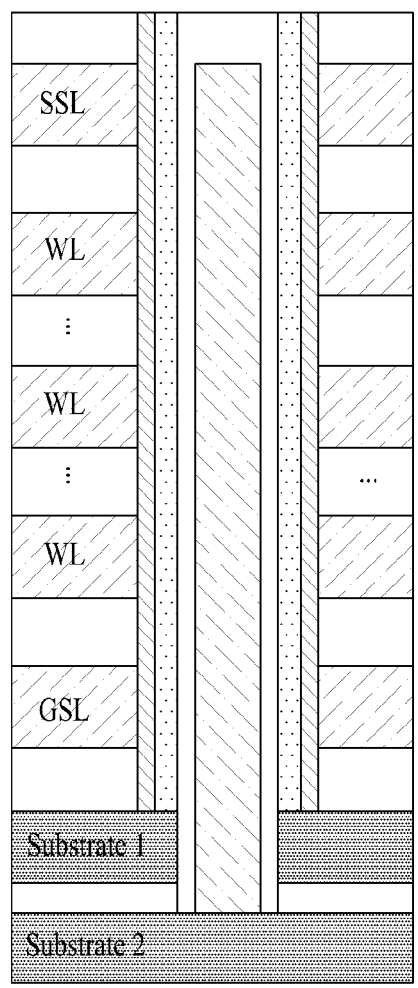

FIG. 21 is a flowchart illustrating a three-dimensional flash memory manufacturing method according to another embodiment, and FIGS. 22A and 22B are Y-Z cross-sectional views for describing an implementation example of the three-dimensional flash memory manufacturing method illustrated in FIG. 21.

Referring to FIG. 21, in operation S2110, a manufacturing system may prepare a lower semiconductor structure.

For example, as illustrated in FIG. 22A, the manufacturing system may prepare a semiconductor structure including a plurality of lower word lines 2220 extended and formed in a horizontal direction on a substrate 2210 so as to be sequentially stacked, a plurality of insulating layers 2230 alternately stacked between the plurality of lower word lines 2220, and a plurality of lower strings 2240 penetrating the plurality of insulating layers 2230 and the plurality of lower word lines 2220 and extended and formed in one direction (e.g., the Z-axis direction) on the substrate 2210.

In this case, in the semiconductor structure, each of the plurality of lower strings 2240 may include a lower channel layer 2241 extended and formed in one direction (e.g., the Z-axis direction) and a lower charge storage layer 2242 extended and formed in one direction (e.g., the Z-axis direction) to surround the lower channel layer 2241. In particular, the lower channel layer 2241 may include a lower back gate 2243 extended and formed in one direction (e.g., the Z-axis direction), with at least a portion of the lower back gate 2243 surrounded by the lower channel layer 2241, and a lower insulating layer 2244 extended and formed in one direction (e.g., the Z-axis direction) between the lower back gate 2243 and the lower channel layer 2241.

Also, the lower semiconductor structure may further include a substrate 2215 for the lower back gate 2243, which is located under the substrate 2210 where the plurality of lower strings 2240 are extended and formed. Next, the lower back gate 2243 and the lower insulating layer 2244 of the lower channel layer 2241 may penetrate the substrate 2210 where the plurality of lower strings 2240 are extended and formed and may be extended and formed to the substrate 2215 for the lower back gate 2243.

In operation S2120, the manufacturing system may prepare an upper semiconductor structure.

For example, as illustrated in FIG. 22A, the manufacturing system may prepare a semiconductor structure including a plurality of upper word lines 2250 extended and formed in the horizontal direction so as to be sequentially stacked, a plurality of upper insulating layers 2260 alternately stacked between the plurality of upper word lines 2250, and a plurality of upper strings 2270 penetrating the plurality of upper insulating layers 2260 and the plurality of upper word lines 2250 and extended and formed in one direction (e.g., the Z-axis direction).

In this case, in the semiconductor structure, each of the plurality of upper strings 2270 may include an upper channel layer 2271 extended and formed in one direction (e.g., the Z-axis direction) and an upper charge storage layer 2272 extended and formed in one direction (e.g., the Z-axis direction) to surround the upper channel layer 2271. In particular, the upper channel layer 2271 may include an upper back gate 2273 extended and formed in one direction (e.g., the Z-axis direction), with at least a portion of the upper back gate 2273 surrounded by the upper channel layer 2271, and an upper insulating layer 2274 extended and formed in one direction (e.g., the Z-axis direction) between the upper back gate 2273 and the upper channel layer 2271.

In operation S2130, as illustrated in FIG. 22B, the manufacturing system may stack the upper semiconductor structure on an upper surface of the lower semiconductor structure such that a cross section of the lower back gate 2243 and a cross section of the upper back gate 2273 coincide with each other.

The three-dimensional flash memory manufacturing method according to another embodiment may be based on a way to use semiconductor structures (i.e., the lower semiconductor structure and the upper semiconductor structure) where all components including the back gates 2243 and 2273 are formed.

FIGS. 23A to 23G are X-Y plan views for describing various structures of a back gate according to an embodiment. Below, for convenience of description, there are illustrated only the following components other than a charge storage layer: a back gate 2310, an insulating layer 2320, and a channel layer 2330.

Referring to FIGS. 23A to 23G, the back gate 2310 and the insulating layer 2320 are formed to be surrounded at least partially by the channel layer 2330. This structure may make it possible to solve an increase of the complexity of process occurring when the back gate 2310 and the insulating layer 2320 are tightly surrounded by the channel layer 2330, and may additionally improve the degree of integration.

Below, that the back gate 2310 and the insulating layer 2320 are at least partially surrounded by the channel layer 2330 means that the back gate 2310 and the insulating layer 2320 are included in at least a portion of the channel layer 2330 or penetrate the channel layer 2330.

Figure 23A:
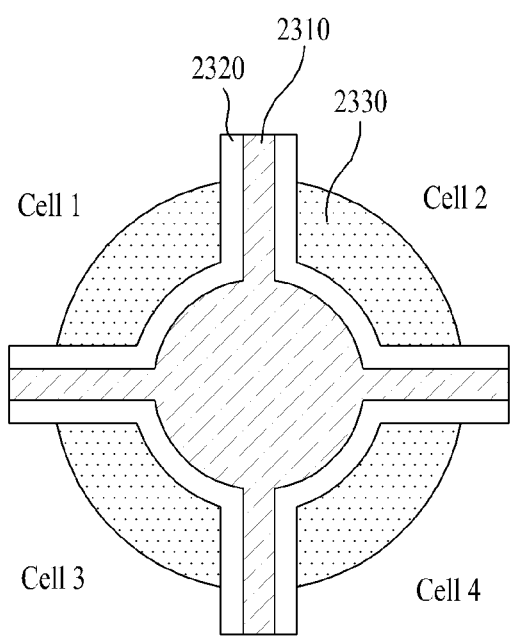
FIGS. 23A to 23G are X-Y plan views for describing various structures of a back gate according to an embodiment.
Figure 23B:
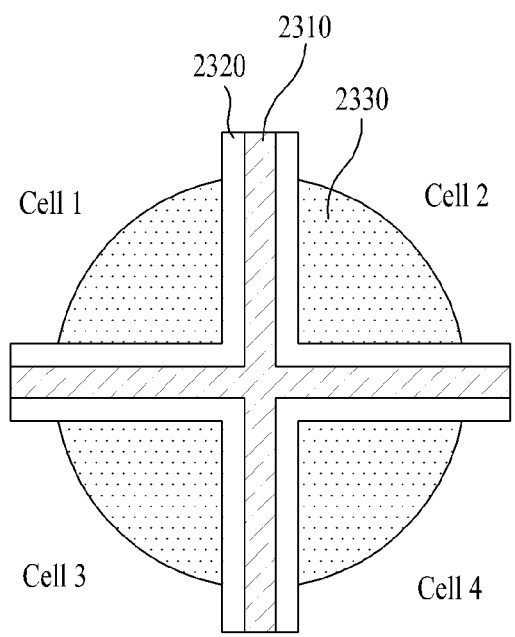
Figure 23C:
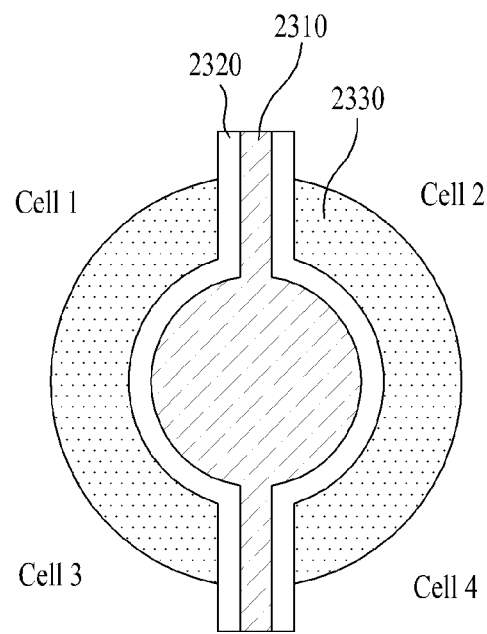
Figure 23D:
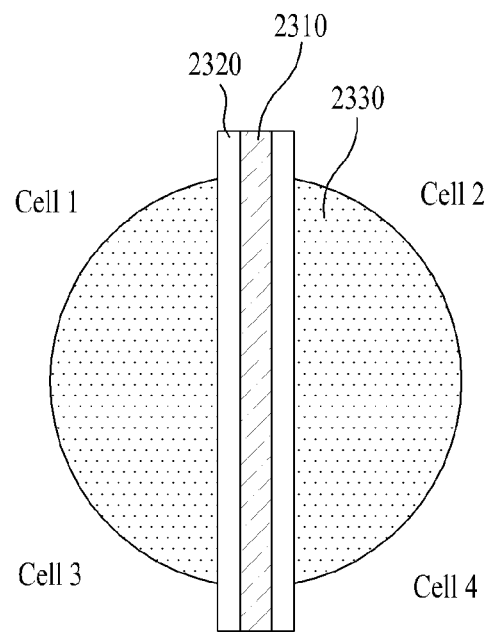

In more detail, as illustrated in FIGS. 23A and 23B, the channel layer 2330 may have a structure in which the channel layer 2330 is segmented by the back gate 2310 and the insulating layer 2320, with the back gate 2310 and the insulating layer 2320 at least partially surrounded by the channel layer 2330. As such, the channel layer 2330 may be divided into four segments corresponding to four cells. As the four cells may be used independently of each other, the degree of integration of memory cells in a three-dimensional flash memory may be improved.

A shape in which the back gate 2310 and the insulating layer 2320 are formed and the number of segments of the channel layer 2330 divided by the back gate 2310 and the insulating layer 2320 based on the shape are not limited to FIGS. 23A and 23B, and may be variously implemented as illustrated in FIGS. 23C to 23G (two segments, three segments, etc.). In this case, the channel layer 2330 may also be formed in various shapes, such as a circle and a quadrangle, as the structure and shape of the back gate 2310 and the insulating layer 2320 are diversified.

That is, in the three-dimensional flash memory, even though the channel layer 2330, the back gate 2310, and the insulating layer 2320 are formed in various shapes, the back gate 2310 and the insulating layer 2320 may be included in at least a portion of the channel layer 2330.

Figure 23E:
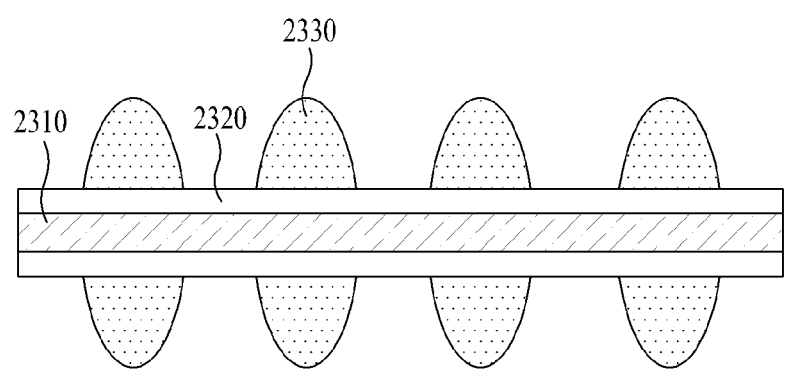
Figure 23F:
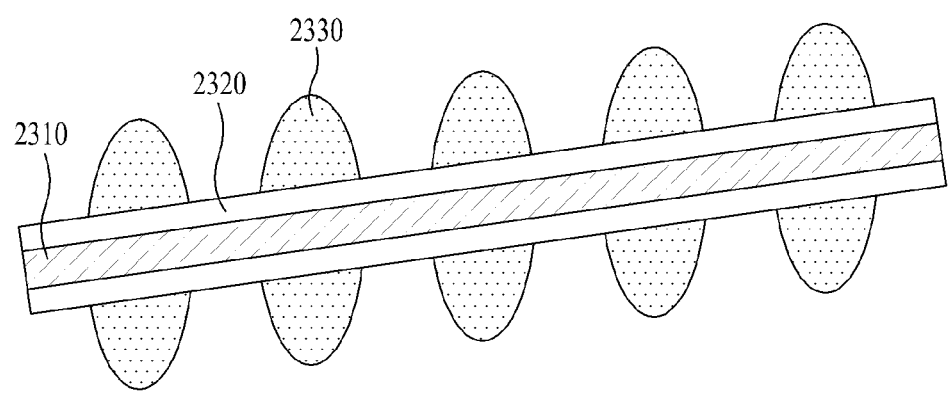
Figure 23G:
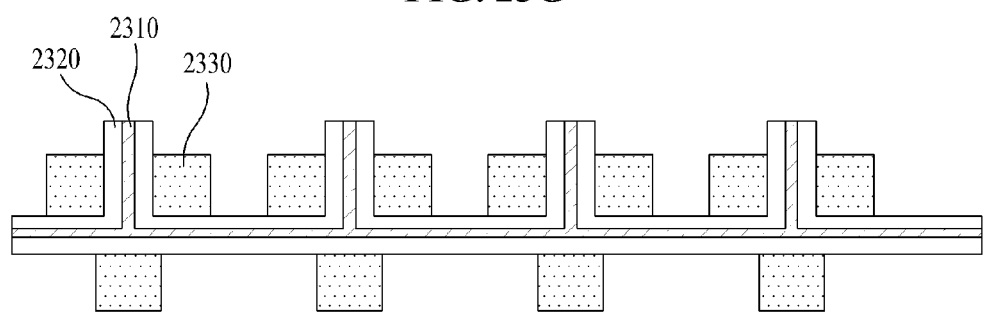

Also, the back gate 2310 may not be formed for each string, but it may be formed in a shape of being shared by a plurality of strings. For example, the back gate 2310 may be shared by a plurality of strings by forming the back gate 2310 in a structure of penetrating side surfaces of the plurality of strings, as illustrated in FIGS. 23E to 23G.

Figure 24:
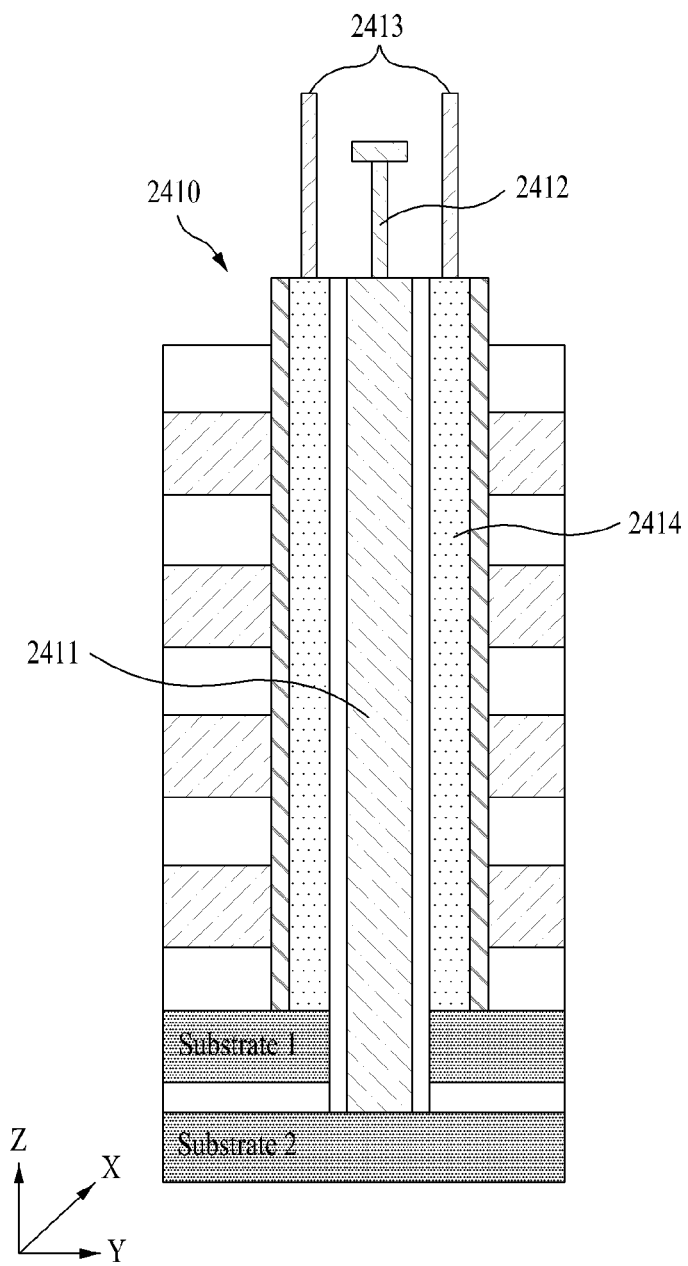
FIG. 24 is a Y-Z cross-sectional view for describing a location where a wire for a voltage to be applied to a back gate is formed, according to an embodiment.

FIG. 24 is a Y-Z cross-sectional view for describing a location where a wire for a voltage to be applied to a back gate is formed, according to an embodiment. A three-dimensional flash memory to be described below may have the same structure as the three-dimensional flash memory 300 described with reference to FIGS. 3A and 3B. However, the three-dimensional flash memory is different from the three-dimensional flash memory 300 in that a wire 2412 for a voltage to be applied to a back gate 2411 is formed over the back gate 2411.

In more detail, the wire 2412 for a voltage to be applied to the back gate 2411 may be formed on a partial region of an upper surface of a string 2410 including the back gate 2411, and the partial region may correspond to the back gate 2411. As such, a bit line 2413 of the string 2410 may be formed on the remaining region of the upper surface of the string 2410, and the remaining region may exclude the back gate 2411 and may include a channel layer 2414.

A process in which the wire 2412 is formed on a partial region, which corresponds to the back gate 2411, of the upper surface of the string 2410 and a process in which the bit line 2413 of the string 2410 is formed on the remaining region, which excludes the back gate 2411 and includes the channel layer 2414, of the upper surface of the string 2410 may be additionally performed after there are performed respective operations included in the manufacturing method described with reference to FIGS. 14 and 15A to 15D, the manufacturing method described with reference to FIGS. 16A and 16B, the manufacturing method described with reference to FIGS. 17 and 18A to 18K, the manufacturing method described with reference to FIGS. 19 and 20A to 20E, or the manufacturing method described with reference to FIGS. 21 and 22A and 22B.

For example, a wire for a voltage to be applied to a back gate and a bit line may be completely manufactured by additionally performing the following after operation S1430 in which the back gate is extended and formed (refer to FIGS. 14 and 15A to 15D): 1) forming the wire for a voltage to be applied to the back gate at a portion, which corresponds to the back gate, of an upper surface of each of a plurality of strings (step of connecting the wire and the back gate), and 2) forming the bit line of each of the plurality of strings at a portion, which corresponds to a channel layer, of the upper surface of each of the plurality of strings.

According to embodiments, a three-dimensional flash memory with a structure in which a back gate is extended and formed within a channel layer may be provided, and thus, a cell characteristic and reliability may be improved.

In more detail, a three-dimensional flash memory including a back gate to which a pass voltage for forming a channel at a channel layer or boosting the channel layer is applied may be provided.

While the inventive concept has been described with reference to exemplary embodiments, it will be apparent to those skilled in the art that various changes and modifications may be made without departing from the spirit and scope of the inventive concept. Therefore, it should be understood that the above embodiments are not limiting, but illustrative.

What is claimed is:

1. A three-dimensional flash memory comprising:
a plurality of word lines extended and formed in a horizontal direction on a substrate so as to be sequentially stacked; and
a plurality of strings penetrating the plurality of word lines and extended and formed in one direction on the substrate, wherein each of the plurality of strings includes:
a channel layer extended and formed in the one direction; and
a charge storage layer extended and formed in the one direction to surround the channel layer, the channel layer and the charge storage layer constituting a plurality of memory cells corresponding to the plurality of word lines;
wherein the channel layer includes:
a back gate extended and formed in the one direction, with at least a portion of the back gate surrounded by the channel layer; and
an insulating layer extended and formed in the one direction between the back gate and the channel layer, and
wherein, in a program operation associated with a target memory cell, a pass voltage for forming a channel at the channel layer or boosting the channel layer is applied to the back gate.

2. The three-dimensional flash memory of claim 1, wherein the channel layer included in a selected string corresponding to the target memory cell from among the plurality of strings forms a channel for a program operation for the target memory cell when a ground voltage is applied to a bit line of the selected string, a program voltage is applied to a word line corresponding to the target memory cell from among the plurality of word lines, and word lines corresponding to remaining memory cells other than the target memory cell from among the plurality of word lines are floated in a state where the pass voltage is applied to the back gate.

3. The three-dimensional flash memory of claim 1, wherein the channel layer included in an unselected string not corresponding to the target memory cell from among the plurality of strings is boosted when the pass voltage is applied to the back gate in a state where the unselected string itself is floated as a power supply voltage is applied to a bit line of the unselected string, and the power supply voltage is applied to a string selection line (SSL) of the unselected string, thereby preventing memory cells included in the unselected string from being programmed by a program voltage for the target memory cell.

4. A three-dimensional flash memory comprising:
a plurality of word lines extended and formed in a horizontal direction on a substrate so as to be sequentially stacked; and
a plurality of strings penetrating the plurality of word lines and extended and formed in one direction on the substrate, wherein each of the plurality of strings includes:
a channel layer extended and formed in the one direction; and
a charge storage layer extended and formed in the one direction to surround the channel layer, the channel layer and the charge storage layer constituting a plurality of memory cells corresponding to the plurality of word lines;
wherein the channel layer includes:
a back gate extended and formed in the one direction, with at least a portion of the back gate surrounded by the channel layer; and
an insulating layer extended and formed in the one direction between the back gate and the channel layer, and
wherein a region of the insulating layer, which corresponds to a ground selection line (GSL) located under the plurality of word lines, or a region of the channel layer, which corresponds to the GSL, has a structure for preventing a leakage current at the GSL.

5. The three-dimensional flash memory of claim 1, wherein the back gate is extended and formed across an inner region of the channel layer corresponding to the plurality of word lines.

6. The three-dimensional flash memory of claim 5, wherein the back gate penetrates the substrate where the plurality of strings are extended and formed and is extended and formed to a substrate for the back gate located under the substrate where the plurality of strings are extended and formed, and
wherein the substrate for the back gate is used for heat dissipation of the plurality of strings.

7. The three-dimensional flash memory of claim 5, wherein the back gate penetrates the substrate where the plurality of strings are extended and formed and is extended and formed to a back gate plate disposed in the horizontal direction under the substrate where the plurality of strings are extended and formed, and
wherein the back gate plate alleviates a film stress of the plurality of word lines between the plurality of word lines and the substrate such that a warpage of the substrate is prevented.

8. The three-dimensional flash memory of claim 1, wherein, in a read operation associated with the plurality of memory cells, a program enhanced voltage for increasing threshold voltages of the plurality of memory cells such that a program speed of the plurality of memory cells is improved is applied to the back gate.

9. The three-dimensional flash memory of claim 1, wherein, in an erase operation, an erase voltage for memory cells included in the plurality of strings is applied to the back gate.

10. The three-dimensional flash memory of claim 1, wherein, in a program operation associated with a target memory cell, a program enhanced voltage for forming an inversion at the channel layer in the program operation and improving a program speed of the target memory cell is applied to the back gate.

11. The three-dimensional flash memory of claim 1, wherein, in an erase operation, voltages for performing the erase operation for memory cells included in the plurality of strings in two steps are applied to the back gate.

12. A three-dimensional flash memory comprising:
a plurality of word lines extended and formed in a horizontal direction on a substrate so as to be sequentially stacked; and
a plurality of strings penetrating the plurality of word lines and extended and formed in one direction on the substrate, wherein each of the plurality of strings includes:
a channel layer extended and formed in the one direction; and
a charge storage layer extended and formed in the one direction to surround the channel layer, the channel layer and the charge storage layer constituting a plurality of memory cells corresponding to the plurality of word lines;
wherein the channel layer includes:
a back gate extended and formed in the one direction, with at least a portion of the back gate surrounded by the channel layer; and
an insulating layer extended and formed in the one direction between the back gate and the channel layer, and
wherein the channel layer has a structure of being segmented by the back gate.

13. A method for manufacturing a three-dimensional flash memory, the method comprising:
preparing a semiconductor structure including a plurality of word lines extended and formed in a horizontal direction on a substrate so as to be sequentially stacked; a plurality of insulating layers alternately stacked between the plurality of word lines; and a plurality of strings penetrating the plurality of word lines and extended and formed in one direction on the substrate,
wherein each of the plurality of strings includes:
a channel layer extended and formed in the one direction; and
a charge storage layer extended and formed in the one direction to surround the channel layer; and
wherein a hole is extended and formed at the channel layer in the one direction in the semiconductor structure;
extending and forming an insulating layer including an inner hole within the hole in the one direction;
extending and forming the back gate formed of a conductive material in the inner hole of the insulating layer in the one direction;
forming a wire for a voltage to be applied to the back gate at a partial region, which corresponds to the back gate, of an upper surface of each of the plurality of strings; and
forming a bit line of each of the plurality of strings at a partial region, which corresponds to the channel layer, of the upper surface of each of the plurality of strings.

* * * * *